(12) United States Patent  
Kimura et al.

(10) Patent No.: US 8,988,267 B1  
(45) Date of Patent: Mar. 24, 2015

(54) SIGNAL PROCESSING DEVICE AND SIGNAL PROCESSING METHOD

(71) Applicant: Kabushiki Kaisha Toshiba, Minato-ku, Tokyo (JP)

(72) Inventors: Shunsuke Kimura, Kanagawa (JP); Hideyuki Funaki, Tokyo (JP); Go Kawata, Kanagawa (JP); Tetsuro Itakura, Tokyo (JP); Masanori Furuta, Kanagawa (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 14/482,102

(22) Filed: Sep. 10, 2014

(30) Foreign Application Priority Data

Sep. 24, 2013 (JP) ................................. 2013-197356

(51) Int. Cl.
*H03M 1/12* (2006.01)
*G01T 1/29* (2006.01)

(52) U.S. Cl.
CPC ............. *H03M 1/124* (2013.01); *G01T 1/2928* (2013.01)
USPC ............ 341/155; 341/158; 341/164; 341/172

(58) Field of Classification Search
CPC ........... G01T 1/17; G01T 1/171; G01T 1/161; G01T 1/2928; G01T 1/24; G01T 1/243; G01T 1/247; G01T 1/249; H03M 1/12; H03M 1/1215
USPC .......................... 341/155, 156, 158, 164, 172
See application file for complete search history.

(56) References Cited

U.S. PATENT DOCUMENTS

| 5,648,660 | A | 7/1997 | Lee et al. |
| 6,671,345 | B2 * | 12/2003 | Vrettos et al. ................... 378/19 |
| 8,772,726 | B2 * | 7/2014 | Herrmann et al. ......... 250/361 R |
| 8,847,169 | B2 * | 9/2014 | Yuan et al. ............... 250/370.09 |
| 2006/0139198 | A1 * | 6/2006 | Rao et al. ....................... 341/155 |
| 2010/0187432 | A1 | 7/2010 | Herrmann et al. |
| 2013/0041628 | A1 * | 2/2013 | Han et al. ...................... 702/189 |
| 2013/0136234 | A1 | 5/2013 | Noma et al. |

FOREIGN PATENT DOCUMENTS

| JP | 9-197053 | 7/1997 |
| JP | 2004-112077 A | 4/2004 |
| JP | 2007-19816 A | 1/2007 |
| JP | 2010-530535 A | 9/2010 |
| JP | 2013-130568 A | 7/2013 |

* cited by examiner

*Primary Examiner* — Khai M Nguyen
(74) *Attorney, Agent, or Firm* — Ohlandt, Greeley, Ruggiero & Perle, L.L.P.

(57) ABSTRACT

According to an embodiment, a signal processing device includes an integrator, a setting unit, and an analog-to-digital converter. The integrator is configured to integrate an electrical charge corresponding to electromagnetic waves. The integrator includes a capacitor configured to store the electrical charge corresponding to the electromagnetic waves and a discharging circuit configured to discharge the capacitor. The setting unit is configured to set a period of integration of the electrical charge with respect to the integrator. The analog-to-digital converter includes a comparator configured to compare an integration output and a threshold value and a counter configured to output, as digital data of the electrical charge, the number of times for which a value of the integration output becomes not less than the threshold value. The converter is configured to discharge the capacitor during the period of integration by supplying a comparison output of the comparator to the discharging circuit.

6 Claims, 14 Drawing Sheets

SIGNAL PROCESSING DEVICE AND SIGNAL PROCESSING METHOD

CROSS-REFERENCE TO RELATED APPLICATION

This application is based upon and claims the benefit of priority from Japanese Patent Application No. 2013-197356, filed on Sep. 24, 2013; the entire contents of which are incorporated herein by reference.

FIELD

Embodiments described herein relate generally to a signal processing device and a signal processing method.

BACKGROUND

These days, a photon counting computed tomography (CT) device is known in which a detector that implements the photon counting technique is used. Unlike an integral-type detector, a detector implementing the photon counting technique outputs signals that enable individual counting of X-ray photons that have passed through a test subject. Hence, in a photon counting CT device, it becomes possible to reconstruct X-ray CT images having a high signal-to-noise ratio (SN ratio).

Besides, the signals output by a detector implementing the photon counting technique can be used in measuring (differentiating) the energy of the X-ray photons. Hence, in a photon counting CT device, imaging can be done by dividing projection data, which is collected by bombarding X-rays of one type of X-ray tube voltage, into a plurality of energy components.

As a detector implementing the photon counting technique, an "indirect-conversion-type detector" is known in which the incident X-ray photons are temporarily converted into a visible light (a scintillator light) using a scintillator and then the scintillator light is converted into electrical signals (an electrical charge) using an optical sensor such as a photomultiplier tube. Herein, the optical sensor individually detects each scintillator photon obtained by conversion of radiation by the scintillator, and then detects the radiation falling on the scintillator and measures the energy of that radiation.

In order to accurately obtain the photon energy of radiation, the quantity of electrical charge that is generated inside the detector due to the incoming radiation photons needs to be analyzed at a high speed and over a wide dynamic range. Conventionally, a method is known in which an integrating circuit, a sample hold circuit, and an analog-to-digital (AD) converter are used. According to that method, with respect to a wave-height pulse that is proportional to the quantity of electrical charge output by the integrating circuit, sampling/holding is performed and is followed by AD conversion using the AD converter.

However, in the conventional technology, a capacitor disposed in the integrating circuit for the purpose of integrating the electrical charge decides on the upper limit of the electrical charge that can be integrated. Hence, it is difficult to achieve a wide dynamic range.

It is an object of the invention to provide a signal processing device and a signal processing method that enable achieving a high count rate and a high resolution.

DETAILED DESCRIPTION

Figure 1:
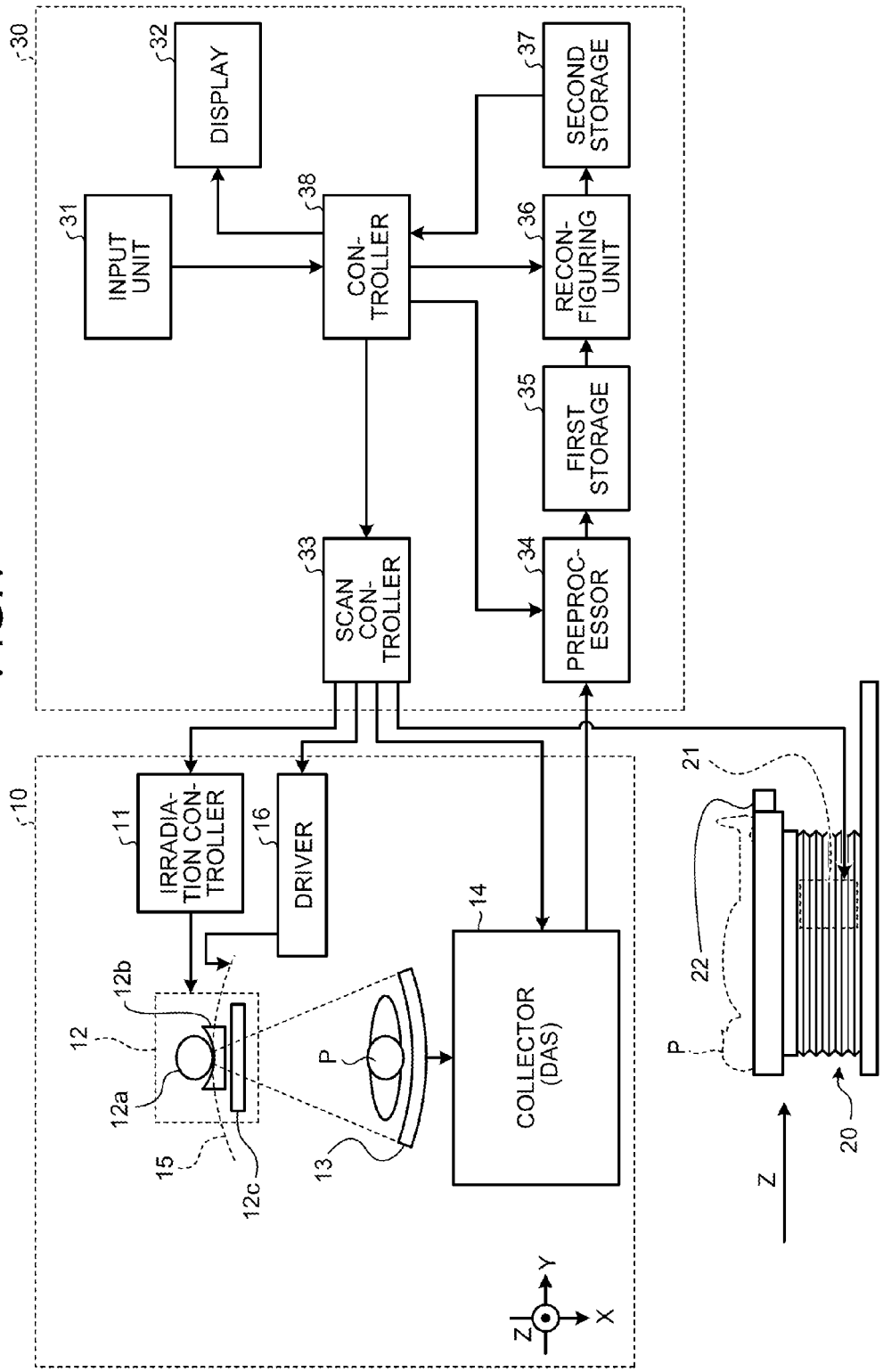
FIG. 1 is a diagram illustrating a configuration of a photon counting computed tomography (CT) device according to a first embodiment.

According to an embodiment, a signal processing device includes an integrator, an integration period setting unit, and an analog-to-digital converter. The integrator is configured to integrate an electrical charge corresponding to electromagnetic waves. The integrator includes an integrating capacitor configured to store the electrical charge corresponding to the electromagnetic waves and a discharging circuit configured to discharge the integrating capacitor. The integration period setting unit is configured to set a period of integration of the electrical charge with respect to the integrator. The analog-to-digital converter includes a comparator configured to compare an integration output and a predetermined threshold value and a counter configured to output, as digital data of the electrical charge, the number of times for which a value of the integration output becomes equal to or greater than the predetermined threshold value. The analog-to-digital converter is configured to discharge the integrating capacitor during the period of integration by supplying a comparison output of the comparator to the discharging circuit while a value of the integration value is equal to or greater than the predetermined threshold value.

Exemplary embodiments of a signal processing device and a signal processing method are described below in detail with reference to the accompanying drawings. The signal processing device and the signal processing method can be suitably implemented in a converting unit that converts electromagnetic waves into an electrical charge. Moreover, the signal processing device and the signal processing method can be suitably implemented in a device having a high count rate. With reference to the accompanying drawings, the following explanation is given in detail for an example in which the signal processing device and the signal processing method are implemented in a photon counting CT device that includes an "indirect-conversion-type detector" in which a scintillator light corresponding to X-ray photons is converted into an electrical charge.

Alternatively, the signal processing device and the signal processing method can also be implemented in a "direct-conversion-type detector" in which the incoming electromagnetic waves are directly converted into an electrical charge. In this case too, it is possible to achieve the same effect as the effect described later. For details, the following explanation can be referred to.

First Embodiment

In a photon counting CT device, a detector implementing the photon counting technique is used to count the photons originating from the X-rays that have passed through a test subject (i.e., to count the X-ray photons); and X-ray CT image data having a high SN ratio is accordingly reconstructed. Each individual photon has a different amount of energy. In a photon counting CT device, information about the energy component of the X-rays is obtained by measuring the energy values of the photons. Moreover, in a photon counting CT device, imaging is done by dividing projection data, which is collected by driving an X-ray tube at one type of X-ray tube voltage, into a plurality of energy components.

In FIG. 1 is illustrated a configuration of a photon counting CT device according to a first embodiment. As illustrated in FIG. 1, the photon counting CT device includes a mount device 10, a berth device 20, and a console device 30.

The mount device 10 includes an irradiation controller 11, an X-ray generating device 12, a detector 13, a collector (DAS: data acquisition system) 14, a rotating frame 15, and a driver 16. The mount device 10 bombards a test subject P with X-rays, and counts the X-rays that have passed through the test subject P.

The rotating frame 15 supports the X-ray generating device 12 and the detector 13 in such a way that the X-ray generating device 12 and the detector 13 are positioned opposite to each other across the test subject P. The rotating frame 15 is a toric frame that rotates at a high speed in a circular path around the test subject P due to the driver 16 (described later).

The X-ray generating device 12 includes an X-ray tube 12a, a wedge 12b, and a collimator 12c. The X-ray generating device 12 generates X-rays and bombards the test subject P with the X-rays. The X-ray tube 12a is a vacuum tube for bombarding the test subject P with X-rays in response to a high voltage supplied from the X-ray generating device 12 (described later). The X-ray tube 12a keeps rotating according to the rotation of the rotating frame 15 and bombards the test subject P with X-ray beams. Meanwhile, the X-ray tube 12a generates X-ray beams that expand with a fan angle and a cone angle.

The wedge 12b is an X-ray filter used in adjusting the X-ray dosage of the X-rays bombarded from the X-ray tube 12a. More particularly, through the wedge 12b, the X-rays bombarded from the X-ray tube 12a pass and undergo attenuation in such a way that the X-rays bombarded toward the test subject P have a predetermined distribution.

For example, the wedge 12b is filter made by processing aluminum to have a predetermined target angle and a predetermined thickness. A wedge is also called a wedge filter or a bow-tie filter. The collimator 12c is a slit that, under the control of the irradiation controller 11 (described later), narrows the range of bombardment of the X-rays for which the wedge 12b has adjusted the X-ray dosage.

The irradiation controller 11 functions as a high-voltage generating unit that supplies a high voltage to the X-ray tube 12a. The X-ray tube 12a generates X-rays using the high voltage supplied from the irradiation controller 11. Moreover, the irradiation controller 11 adjusts the tube voltage or the tube current supplied to the X-ray tube 12a and adjusts the X-ray dosage with which the test subject P is bombarded. Moreover, the irradiation controller 11 adjusts the aperture of the collimator 12c so as to adjust the range of bombardment (the fan angle or the cone angle) of the X-rays.

The driver 16 rotary-drives the rotating frame 15 so that the X-ray generating device 12 and the detector 13 swirl on a circular path around the test subject P. Every time there is incoming radiation of an X-ray photon, the detector 13 outputs signals that enable measuring the energy value of that X-ray photon. The X-ray photons referred to herein are, for example, the X-ray photons that are bombarded from the X-ray tube 12a and that have passed through the test subject P. The detector 13 includes a plurality of detecting elements that, every time there is incoming radiation of an X-ray photon, outputs single-pulse electrical signals (analog signals).

By counting the number of electrical signals (pulses), it becomes possible to count the number of X-ray photons falling on each detecting element. Moreover, by performing predetermined arithmetic processing with respect to those signals, it becomes possible to measure the electrical energy of the X-ray photons that prompted the output of the signals.

A detecting element of the detector 13 is made of a scintillator and an optical sensor such as a photomultiplier tube. Hence, the detector 13 is what is called an "indirect-conversion-type detector". In the detector 13, incident X-ray photons are temporarily converted into a visible light (a scintillator light) using the scintillators, and then the scintillator light is converted into electrical signals using the optical sensors such as the photomultiplier tubes.

Figure 2:
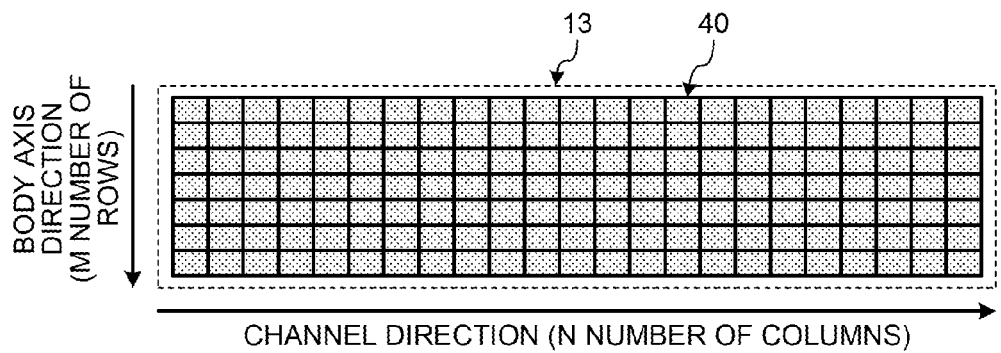
FIG. 2 is a planar view of a detector that is disposed in the photon counting CT device according to the first embodiment.

In FIG. 2 is illustrated an example of the detector 13. Herein, the detector 13 is a plane detector in which detecting elements 40, each of which is made of a scintillator and an optical sensor such as a photomultiplier tube, are disposed for N number of columns in a channel direction (in the Y-axis direction with reference to FIG. 1) and for M number of rows in a body axis direction (in the Z-axis direction with reference to FIG. 1). In response to the incidence of photons, the detecting elements 40 output single-pulse electrical signals. Then, by differentiating the individual pulses output by the detecting elements 40, it becomes possible to count the number of X-ray photons falling on the detecting elements 40. Moreover, by performing arithmetic processing based on the intensities of the pulses, it becomes possible to measure the energy values of the X-ray photons that are counted.

At the second stage of the detector 13, a circuit called an analog front end is disposed that integrates and digitizes the electrical charge output from each detecting element, and supplies the resultant output to the collector 14 illustrated in FIG. 1. The details of the analog front end are described later.

The collector 14 collects counting information, which represents the result of a counting operation performed using the output signals output from the detector 13. That is, the collector 14 differentiates the individual signals output from the detector 13 and collects the counting information. Herein, the counting information represents the information that, every time there is incoming radiation of an X-ray photon which was bombarded from the X-ray tube 12a and which has passed through the test subject P, is collected from the individual signals output by the detector 13 (the detecting circuits 40). More particularly, in the counting information, the enumerated data of the X-ray photons falling on the detector 13 (the detecting elements 40) is held in a corresponding manner to the energy values of the X-ray photons. Meanwhile, the collector 14 sends the collected counting information to the console device 30.

That is, for each phase (tube phase) of the X-ray tube 12a, the collector 14 collects, as the counting information, the incident positions (the detection positions) of the X-ray photons, which are counted by differentiating the pulses output by the detecting elements 40, and the energy values of those X-ray photons. For example, as an incident position, the collector 14 treats the position of each detecting element 40 that outputs a pulse (an electrical signal) used in the counting. Moreover, the collector 14 performs predetermined arithmetic processing with respect to the electrical signals and measures the energy values of the X-ray photons.

The berth device 20 illustrated in FIG. 1 is a device on which the test subject P is made to lie down, and includes a top panel 22 and a berth driving device 21. The top panel 22 is a panel on which the test subject is made to lie down. The berth driving device 21 moves the top panel 22 in the Z-axis direction so that the test subject P moves inside the rotating frame 15.

The mount device 10 performs, for example, helical scanning in which the rotating frame 15 is rotated while moving the top panel 22 so that the test subject P is scanned in a helical manner. Alternatively, the mount device 10 performs conventional scanning in which, after the top panel 22 is moved, the rotating frame 15 is rotated while keeping the position of the test subject P fixed so that the test subject P is scanned in a circular path. Still alternatively, the mount device 10 performs conventional scanning by implementing the step and shoot method in which the position of the top panel 22 is moved at regular intervals and the conventional scanning is performed at a plurality of scan areas.

The console device 30 includes an input unit 31, a display 32, a scan controller 33, a preprocessor 34, a first storage 35, a reconfiguring unit 36, a second storage 37, and a controller 38. The console device 30 receives operations performed by an operator with respect to the photon counting CT device as well as reconfigures X-ray CT images using the counting information collected by the mount device 10.

The input unit 31 includes a mouse or a keyboard that is used by the operator of the photon counting CT device for the purpose of inputting various instructions and various settings; and transfers the instructions and the settings, which are received from the operator, to the controller 38. For example, from the operator, the input unit 31 receives imaging conditions related to X-ray CT image data, reconfiguration conditions at the time of reconfiguring the X-ray CT image data, and image processing conditions with respect to the X-ray CT image data.

The display 32 is a monitor device referred to by the operator. Under the control of the controller 38, the display 32 displays the X-ray CT image data as well as displays a graphic user interface (GUI) that enables the operator to input various instructions and various settings via the input unit 31.

The scan controller 33 controls the operations of the irradiation controller 11, the driver 16, the collector 14, and the berth driving device 21 under the control of the controller 38; and controls the counting information collecting operation in the mount device 10.

The preprocessor 34 generates projection data by performing correction operations such as logarithmic conversion, offset correction, sensitivity correction, and beam hardening correction with respect to the counting information sent from the collector 14.

The first storage 35 is used to store the projection data generated by the preprocessor 34. That is, the first storage 35 is used to store the projection data (i.e., the corrected counting information) that is used in reconfiguring the X-ray CT image data.

The reconfiguring unit 36 reconfigures the X-ray CT image data using the projection data stored in the first storage 35. Herein, the reconfiguration can be performed by implementing various methods such as the back projection method. Examples of the back projection method include the filtered back projection (FBP). Moreover, the reconfiguring unit 36 performs a variety of image processing with respect to the X-ray CT image data, and generates image data. Then, the reconfiguring unit 36 stores the reconfigured X-ray CT image data and the image data, which is generated by performing a variety of image processing, in the second storage 37.

The projection data that is generated from the counting information, which is obtained in the photon counting CT device, contains energy information of the X-rays that are attenuated due to passing through the test subject P. Hence, for example, the reconfiguring unit 36 can reconfigure the X-ray CT image data of particular energy components. Moreover, for example, the reconfiguring unit 36 can reconfigure the X-ray CT image data of each of a plurality of energy components.

Furthermore, according to each energy component, the reconfiguring unit 36 can assign a color tone to each pixel of the X-ray CT image data of that energy component; and can generate a plurality of sets of X-ray CT image data that is color coded according to the energy components. Moreover, the reconfiguring unit 36 can generate image data by superposing these sets of X-ray CT image data.

The controller 38 controls the operations of the mount device 10, the berth device 20, and the console device 30; and performs the overall control of the photon counting CT device. More particularly, the controller 38 controls the scan controller 33 so as to control the CT scanning performed in the mount device 10. Moreover, the controller 38 controls the preprocessor 34 and the reconfiguring unit 36 so as to control the image reconfiguration operation and the image generating operation performed in the console device 30. Furthermore, the controller 38 performs control to display a variety of image data, which is stored in the second storage 37, on the display 32.

Figure 3:
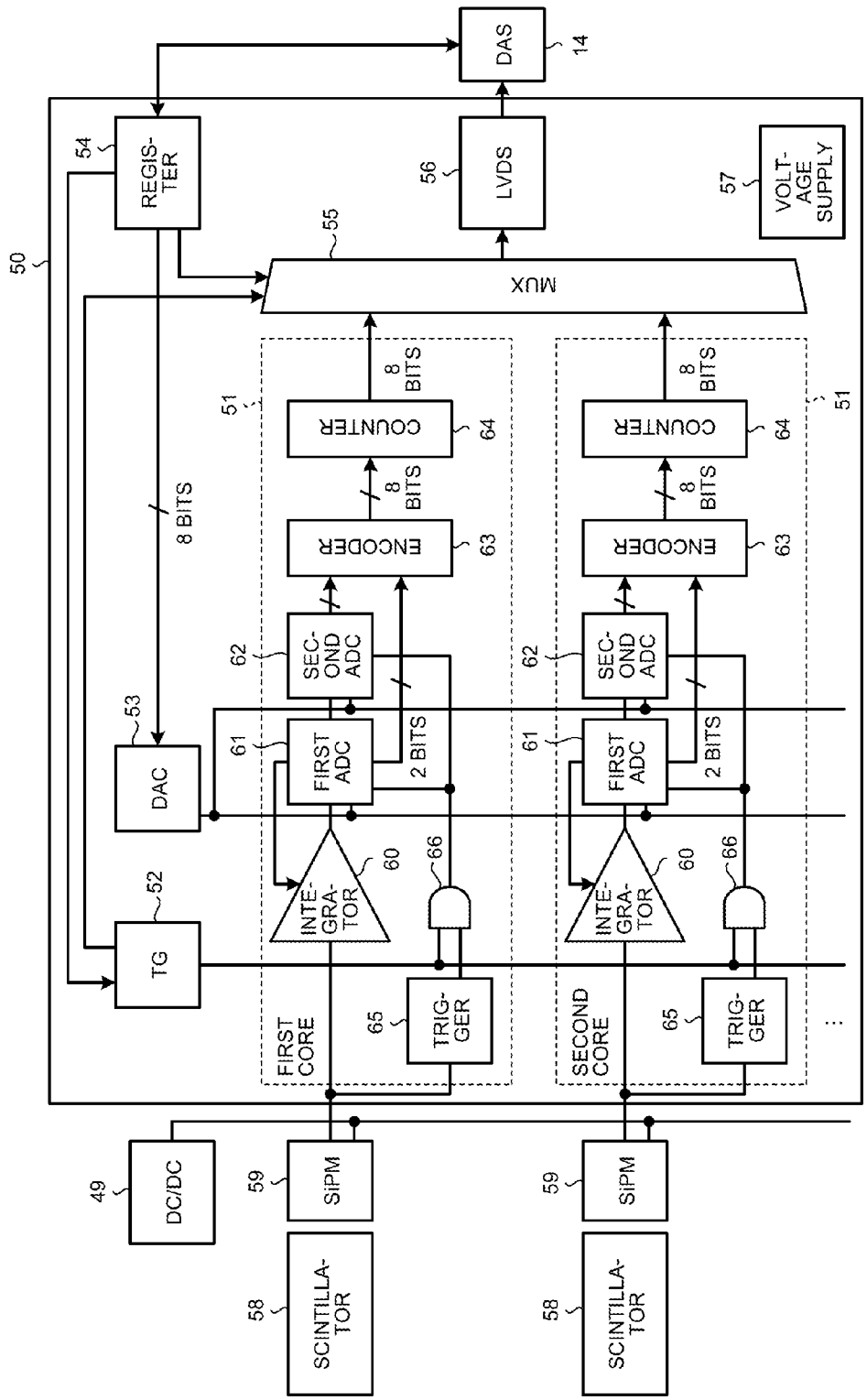
FIG. 3 is a block diagram of an analog front end that is disposed in the detector of the photon counting CT device according to the first embodiment.

In FIG. 3 is illustrated a block diagram of an analog front end 50 that is disposed at the second stage of the detector 13. In this example, the analog front end 50 is an application specific integrated circuit (ASIC). The analog front end 50 includes a DC/DC converter 49, a plurality of cores 51 (a first core to an n-th core (where n is a natural number equal to or greater than two)), and a digital-to-analog converter (DAC) 53. Moreover, the analog front end 50 includes a register 54, a multiplexer (MUX) 55, a low voltage differential signaling (LVDS) interface 56, and a power-supply unit 57.

To each core 51, the electrical charge corresponding to the dosage of the incident X-rays is supplied via a scintillator 58 and a silicon photomultiplier (SiPM) 59. The MUX 55 switches X-ray energy distributions, which are formed in the form of histograms by the cores 51, at predetermined timings; and supplies the energy distribution to the DAS 14 via the LVDS 56 that serves as a short-range communication interface.

Each core 51 includes an integrator 60, a first analog-to-digital converter (first ADC) 61, a second ADC 62, an encoder 63, a counter 64, a trigger circuit 65, and an output control circuit 66.

The integrator 60 integrates, for a predetermined period of time, the electrical charge corresponding to the X-ray dosage. The first ADC 61, which is the analog-to-digital converter disposed at the first stage, performs AD conversion at a coarse resolution with respect to the integration output from the integrator 60. The second ADC 62, which is the analog-to-digital converter disposed at the second stage, performs AD conversion with respect to the residual integration output that was not subjected to AD conversion in the first ADC 61.

As a specific example, each core 51 is configured to eventually supply an 8-bit AD conversion output to the MUX 55. The first ADC 61, which is the analog-to-digital converter disposed at the first stage, is, for example, a cyclic-type AD converter or a folding-type AD converter. By configuring the first ADC 61 as a cyclic-type AD conversion or a folding-type AD converter, AD conversion of the input electrical charge can be performed on a parallel with the integration performed by the integrator 60.

As a result of performing coarse AD conversion of the integration output, the first ADC 61 generates a 2-bit AD conversion output. The second ADC 62, which is the analog-to-digital converter disposed at the second stage, is, for example, a successive-approximation register (SAR) AD converter. The second ADC 62 performs AD conversion with respect to the residual integration output that was not subjected to AD conversion in the first ADC 61, and generates a 6-bit AD conversion output.

The encoder 63 generates an 8-bit AD conversion output from the 2-bit AD conversion output of the first ADC 61 and the 6-bit AD conversion output of the second ADC 62; and supplies the 8-bit AD conversion output to the counter 64. Then, from the 8-bit AD conversion output, the counter 64 forms and outputs a histogram of the X-ray energy distribution.

Figure 4:
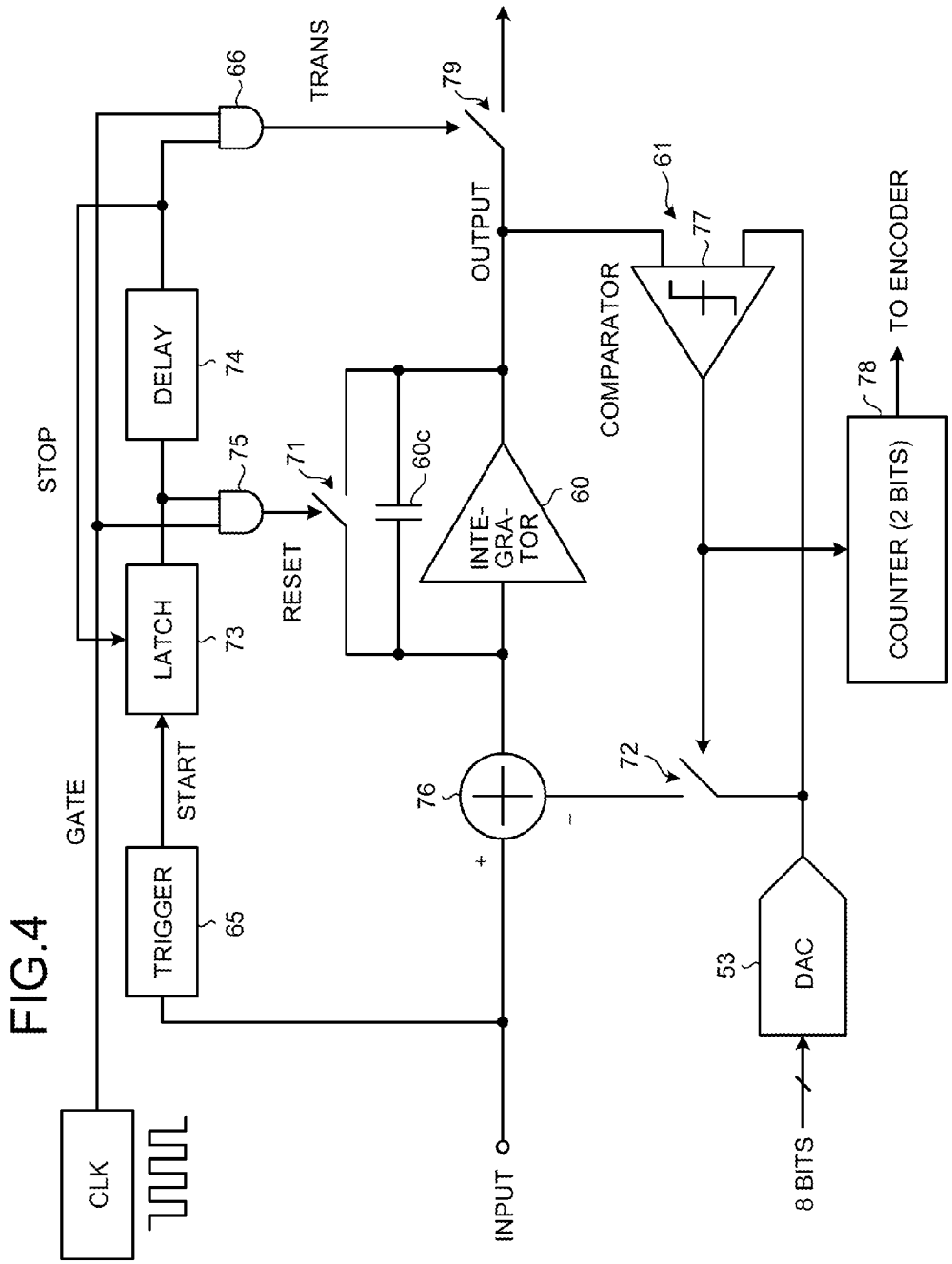
FIG. 4 is a detailed block diagram of the surrounding portion of an integrator and a first analog-to-digital converter (ADC) of each core in the analog front end of the photon counting CT device according to the first embodiment.

In FIG. 4 is illustrated a detailed block diagram of the surrounding portion of the integrator 60 and the first ADC 61 of each core 51. As illustrated in FIG. 4, each core 51 includes a first discharging switch 71 and a second discharging switch 72 that are used in discharging the electrical charge stored in an integrating capacitor 60c. Moreover, each core 51 includes the trigger circuit 65, a latch circuit 73, a delay circuit 74, a first switch control circuit 75, and the output control circuit 66. Furthermore, each core 51 includes an adder 76, a comparator 77, a counter 78, and an output control switch 79. Herein, the trigger circuit 65, the latch circuit 73, the delay circuit 74, and the first switch control circuit 75 represent an example of a period of integration setting unit.

The trigger circuit 65 generates a start pulse in response to the start of the input of the electrical charge corresponding to the scintillator photons. The latch circuit 73 latches the start pulse during a predetermined period of integration. The delay circuit 74 delays the latch output of the start pulse by a predetermined amount of time and generates a stop pulse. Then, the stop pulse is supplied to the latch circuit 73 and the output control circuit 66. Thus, until the stop pulse is supplied from the delay circuit 74, the latch circuit 73 latches the start pulse. The latching period of the start pulse (=the delay period for the delay circuit 74) represents the period of integration of the electrical charge that has been input.

The first switch control circuit 75 controls the first discharging switch 71 in such a way that, except during the period of integration, the electrical charge stored in the integrating capacitor 60c is periodically discharged (and the output signal is reset). On the other hand, during the period of integration, the first switch control circuit 75 performs control to stop the supply of the reset pulse to the first discharging switch 71.

The second discharging switch 72 operates in the following manner: during the period of integration of the electrical charge, every time the integration output becomes equal to a predetermined threshold value, the second discharging switch 72 discharges the electrical charge stored in the integrating capacitor 60c according to a comparison output from the comparator 77. The DA converter 53 sets a predetermined threshold value Vth with respect to the comparator 77. The comparator 77 compares the integration output from the integrator 60 with the threshold value Vth. While the value of the integration output is equal to or greater than the threshold value Vth, the comparator 77 outputs a high-level comparison output. Due to the high-level comparison output, ON control is performed with respect to the second discharging switch 72.

As a result, during the period of integration of the electrical charge, every time the value of the integration output becomes equal to or greater than the threshold value Vth, the electrical charge stored in the integrating capacitor 60c is connected to ground and discharged. Alternatively, during the period of integration of the electrical charge, every time the value of the integration output becomes equal to or greater than the threshold value Vth; the threshold value Vth set in the DA converter 53 is invertingly input to the adder 76. As a result, of the electrical charge stored in the integrating capacitor 60c, the electrical charge equivalent to the threshold value Vth, which is set in the DA converter 53, is discharged.

Figure 5:
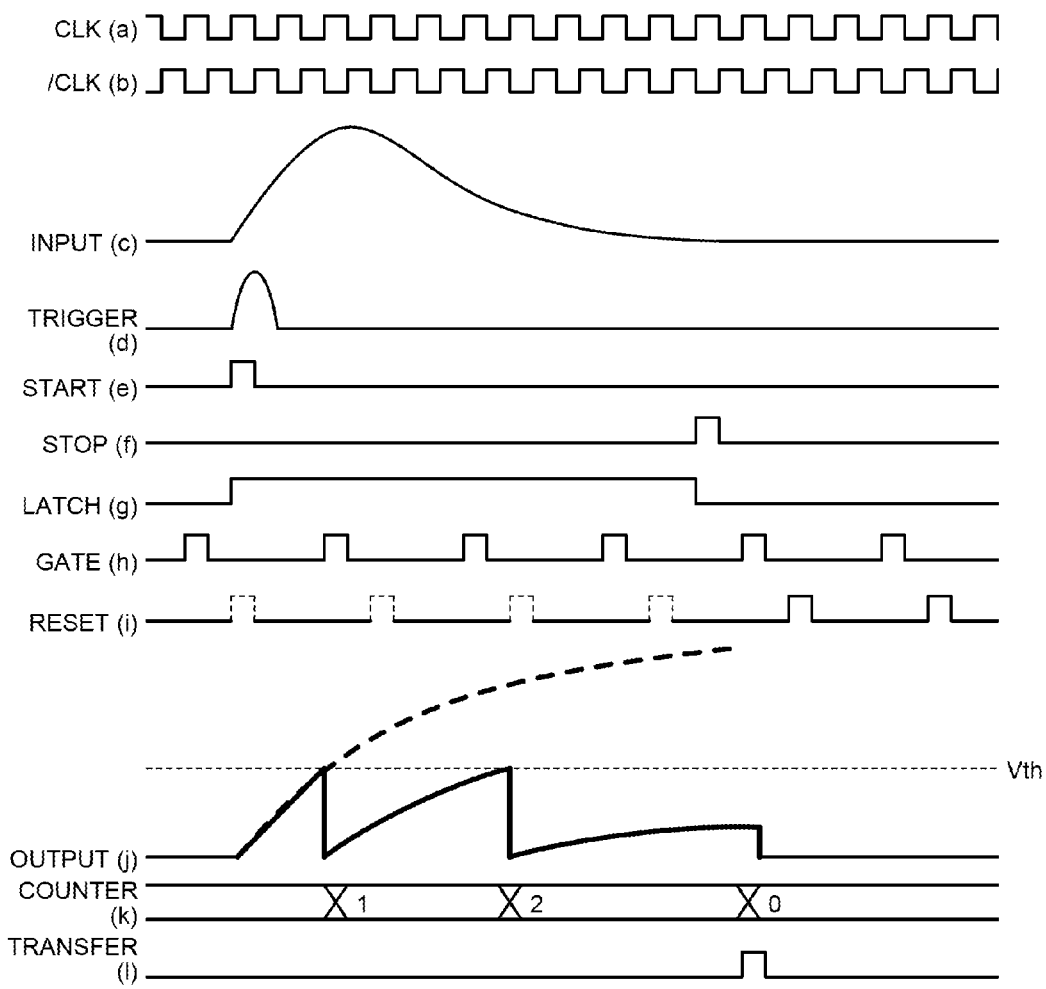
FIG. 5 is a timing chart for explaining the operations of constituent elements surrounding the integrator and the first ADC in each core according to the first embodiment.

FIG. 5 is a timing chart for explaining the operations of these constituent elements. In FIG. 5, the clock referred to by a reference code (a) represents a clock (CLK) supplied from the register 54 illustrated in FIG. 3 to a timing generator 52. Moreover, in FIG. 5, the clock referred to by a reference code (b) represents an inverted clock (/CLK) having the phase thereof inverted by the timing generator 52. Furthermore, in FIG. 5, the signal referred to by a reference code (c) represents the waveform of the electrical charge output from the photomultiplier (SiPM) 59. When the X-rays fall on the scintillator 58, a light gets emitted in the scintillator 58 thereby resulting in the generation of a scintillator light. Herein, the scintillator light attenuates along with time. Hence, the waveform of the electrical charge referred to by the reference code (c) illustrated in FIG. 5 rises in a short period of time and gradually goes on attenuating.

In FIG. 5, the signal referred to by a reference code (d) and the pulse referred to by a reference code (e) represent the start pulse generated in the trigger circuit 65. In response to the input of the electrical charge, the trigger circuit 65 generates a rising signal for a predetermined period of time as illustrated with reference to the reference code (d) in FIG. 5. Then, the trigger circuit 65 performs waveform shaping with respect to the generated signal and generates the start pulse referred to by the reference code (e) in FIG. 5, and supplies the start pulse to the latch circuit 73. Then, as illustrated with reference to a reference code (g) in FIG. 5, the latch circuit 73 latches the start pulse for a predetermined period of time.

The latch output from the latch circuit 73 is supplied to the first switch control circuit 75 and the delay circuit 74. Then, the delay circuit 74 delays the latch output by a predetermined period of time and generates a stop pulse referred to by a reference code (f) in FIG. 5. The stop pulse is then supplied to the latch circuit 73 and the output control circuit 66. At the timing at which the stop pulse is supplied thereto, the latch circuit 73 ends the latch as illustrated with reference to the reference code (g) in FIG. 5. That is, as illustrated with reference to the reference code (g) in FIG. 5, the period of time starting from the point of time at which the start pulse is supplied to the latch circuit 73 to the point of time at which the stop pulse is supplied to the latch circuit 73 represents the period of integration of the electrical charge.

Meanwhile, to the first switch control circuit 75 and the output control circuit 66, a gate pulse is supplied that is referred to by a reference code (h) in FIG. 5 and that is generated by, for example, performing frequency division with respect to the inverted clock (/CLK) output from the timing generator 52. At the timing at which the gate pulse is supplied thereto, the first switch control circuit 75 generates a reset pulse referred to by a reference code (i) in FIG. 5 and supplies the reset pulse to the first discharging switch 71. Thus, every time a reset pulse is supplied, ON control is performed with respect to the first discharging switch 71; the electrical charge stored in the integrating capacitor 60c is released at the timing of the reset pulse; and the integrating capacitor 60c is reset.

During a latch period (i.e., during a period of integration) referred to by the reference code (g) in FIG. 5, the first switch control circuit 75 performs control to stop the supply of the reset pulse to the first discharging switch 71 as illustrated with reference to the reference code (i) in FIG. 5. In FIG. 5, a reference code (j) represents the integration output from the integrator 60. When control is performed to stop the supply of the reset pulse to the first discharging switch 71 during the period of integration, the value of the integration output gradually increases as illustrated by a dotted waveform. However, in the comparator 77 to which the integration output is supplied, the DA converter 53 has set the threshold value Vth illustrated in the integration output referred to by the reference code (j). For that reason, during the period of integration, every time the value of the integration output becomes equal to or greater than the threshold value Vth, the comparator 77 supplies the high-level comparison output to the second discharging switch 72 and the counter 78.

While the high-level comparison output is being supplied, the second discharging switch 72 invertingly inputs the threshold value Vth, which is set the DA converter 53, to the adder 76 to which the electrical charge is being supplied. As a result, during the period of integration of the electrical charge, every time the value of the integration output becomes equal to or greater than the threshold value Vth, the electrical charge stored in the integrating capacitor 60c is discharged depending on an arbitrary electrical potential set in the DA converter 53. Alternatively, during the period of integration of the electrical charge, every time the value of the integration output becomes equal to or greater than the threshold value Vth, the integrating capacitor 60c can be connected to ground and discharged. Once the electrical charge is discharged, the integrating capacitor 60c again starts charging the electrical charge. As a result, the value of the integration output from the integrator 60 gradually increases. In this way, during the period of integration of the electrical charge, the integrating capacitor 60c is controlled in such a way that the discharging and charging of the electrical charge is repeated with reference to the threshold value Vth.

The counter 78 counts the number of high-level comparison outputs supplied during the period of integration. Hence, during the period of integration of the electrical charge, every time the electrical charge of the integrating capacitor 60c is discharged, the counter 78 increments the count value by one as illustrated with reference to a reference code (k) in FIG. 5. In the example illustrated with reference to the reference code (k) in FIG. 5, it is illustrated that, during the period of integration, the comparison output is twice set to the high level. Hence, in this case, the count value of the counter 78 is "2". Then, the counter 78 supplies that count value as the AD conversion value of the first ADC 61 to the encoder 63 illustrated in FIG. 3 in, for example, the form of 2-bit data.

In this way, in the photon counting CT device according to the first embodiment, the first ADC 61 performs coarse AD conversion with respect to the integration output and generates a 2-bit AD conversion output. The output control circuit 66 performs control to turn OFF the output control switch 79 during the period of integration. Then, upon completion of the period of integration, the output control circuit 66 performs control to turn ON the output control switch 79 at the timing of the stop pulse and at the timing of the start pulse with an output control pulse referred to by a reference code (l) illustrated in FIG. 5. As a result, during the period of integration, the residual integration output that remains after the integration output counted lastly by the counter 78 is supplied to the second ADC 62 disposed at the second stage. Thus, in the example illustrated with reference to the reference code (j) in FIG. 5, during the period of integration, the integration output starting from the second count up to but not including the threshold value Vth is supplied to the second ADC 62 disposed at the second stage.

Moreover, in the first embodiment, the first ADC 61 performs coarse AD conversion, and the second ADC 62 performs fine AD conversion with respect to the residual integration output. For that reason, during the period of integration, the residual integration output that remains after the integration output counted lastly by the counter 78 is supplied to the second ADC 62 disposed at the second stage. However, in the case of a device in which only coarse AD conversion values are used, the configuration may not include the second ADC 62 and only the AD conversion from the first ADC 61 may be used. In this case, the residual integration output that remains after the lastly-counted integration output is destroyed.

Figure 6:
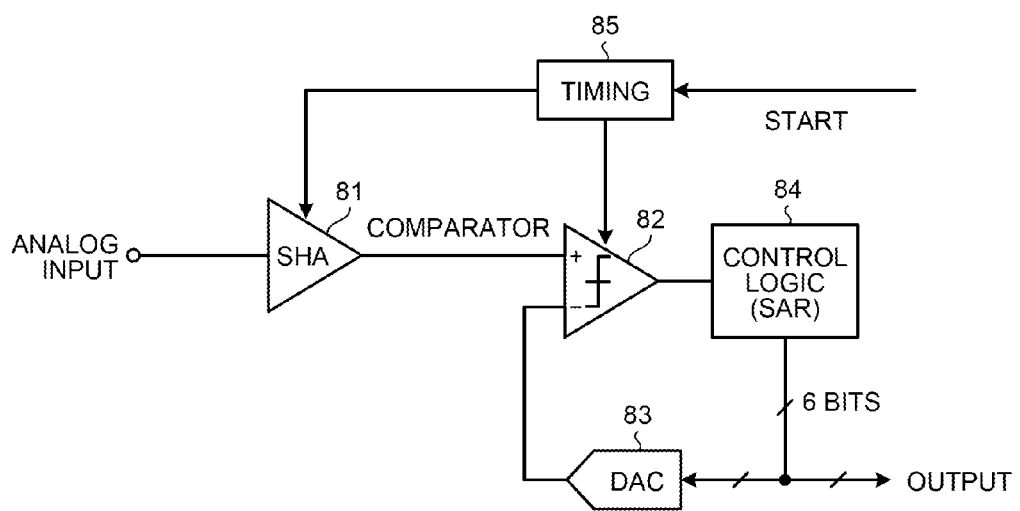
FIG. 6 is a block diagram of a second ADC that is disposed in each core in the analog front end of the photon counting CT device according to the first embodiment.

In FIG. 6 is illustrated a block diagram of the second ADC 62 disposed at the second stage. Herein, the second ADC 62 disposed at the second stage is, for example, a successive-approximation type (SAR) AD converter. The second ADC 62 performs AD conversion with respect to the residual integration output that was not subjected to AD conversion in the first ADC 61, and generates a 6-bit AD conversion output.

More particularly, the second ADC 62 includes a sample hold amplifier (SHA) 81, a comparator 82, and an n-bit DA converter (where n is a natural number) 83. Moreover, the second ADC 62 includes a successive approximation register (SAR) 84, and a timing control circuit 85.

Firstly, in the second ADC 62, only the most significant bit (MSB) of the DA converter 83 is set to "1" (with rest of the bits set to "0"), and the comparator 82 performs comparison with the input signal. If the input signal is greater, then it is determined to set the MSB to "1". On the other hand, if the input signal is smaller, then it is determined to set the MSB to "0".

Subsequently, "1" is set in the bit that is one rank lower than the MSB, and the comparator 82 performs comparison with the input signal. If the input signal is greater, then it is determined to set the concerned bit to "1". On the other hand, if the input signal is smaller, then it is determined to set the concerned bit to "0". Such a setting operation for each bit is repeated for n number of bits (for example, six bits) and lastly the least significant bit (LSB) is determined. The determination of the LSB marks the end of the AD conversion operation. At the time of completion of AD conversion, the digital data of the DA converter 83 serves as the AD conversion result and is supplied to the encoder 63 illustrated in FIG. 3.

Figure 7:
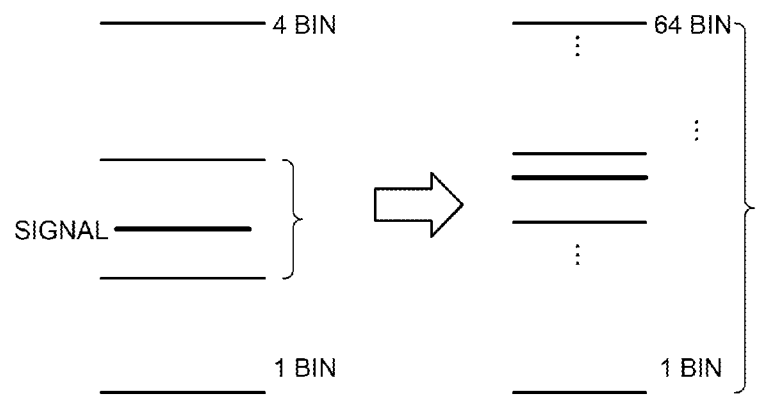
FIG. 7 is a diagram for giving explanation about the resolution that is enhanced as a result of having AD converters in two stages.

In this way, in the photon counting CT device according to the first embodiment, as illustrated in FIG. 7, the first ADC 61 performs coarse AD conversion with respect to the integration output. Then, with respect to the residual integration output that was not subjected to AD conversion in the first ADC 61, the second ADC 62 performs fine AD conversion.

In other words, in the photon counting CT device according to the first embodiment, a cyclic-type (or a folding-type) AD converter is disposed at the first stage. A cyclic-type AD converter can perform AD conversion even during the period of integration. For that reason, by making use of the period of integration, coarse AD conversion is performed using the first ADC 61 disposed at the first stage. Moreover, an SAR-type AD converter having high accuracy is used as the second ADC 62 at the second stage for the purpose of performing fine AD conversion. In this way, by performing AD conversion in a time-shared manner using the first ADC 61 and the second ADC 62, it becomes possible to enhance the apparent resolution in the overall AD conversion, including AD conversion at the first stage and AD conversion at the second stage.

Figure 8:
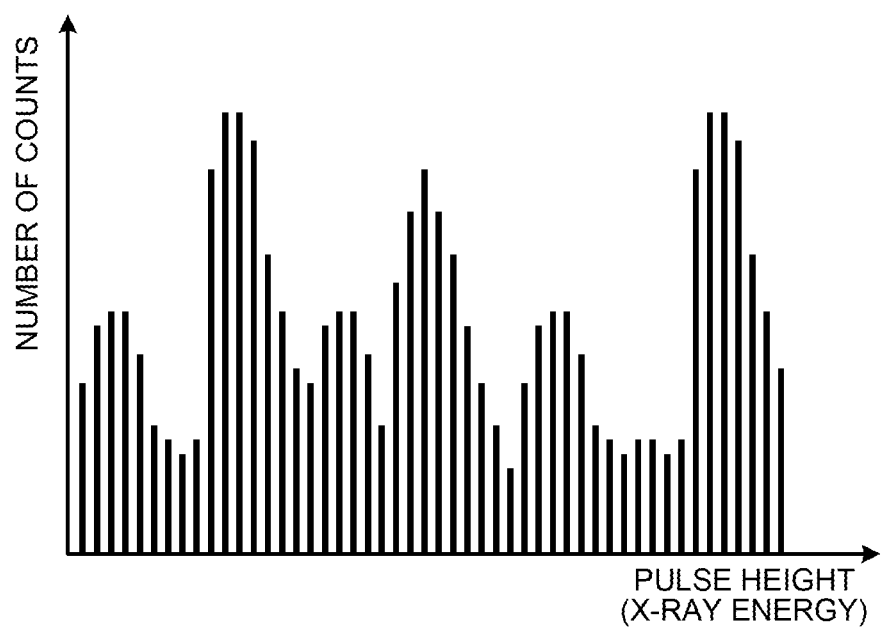
FIG. 8 is a diagram illustrating an exemplary histogram that is generated by a counter disposed in each core in the photon counting CT device according to the first embodiment.

Subsequently, the encoder 63 performs an encoding operation with respect to the 2-bit coarse AD conversion value, which is supplied from the first ADC 61, and the 6-bit fine AD conversion value, which is supplied from the second ADC 62, and generates an 8-bit AD conversion value; and supplies the 8-bit AD conversion value to the counter 64. Then, from the 8-bit AD conversion value received from the encoder 63, the counter 64 generates, for example, a histogram that represents the number of counts of peak values as illustrated in FIG. 8; and supplies the histogram to the multiplexer 55. Herein, at predetermined timings, the multiplexer 55 switches the histograms received from the cores 51; and supplies the histograms to the DAS 14 via the LVDS interface 56.

As is clear from the explanation given above, in the photon counting CT device according to the first embodiment, a cyclic-type (or a folding-type) AD converter is disposed at the first stage. A cyclic-type AD converter can perform AD conversion even during the period of integration. For that reason, by making use of the period of integration, coarse AD conversion is performed using the first ADC 61 disposed at the first stage. Moreover, an SAR-type AD converter having high accuracy is used as the second ADC 62 at the second stage for the purpose of performing fine AD conversion. In this way, by performing AD conversion in a time-shared manner using the first ADC 61 and the second ADC 62, high-speed and high-energy data can be measured at a high resolution in a simultaneous manner in a few hundred channels. As a result, it becomes possible to achieve a photon counting CT device having a high count rate and a high resolution.

Moreover, in the first embodiment, coarse AD conversion is performed using the first ADC 61, while fine AD conversion of the residual integration output is performed using the second ADC 62. For that reason, during the period of integration, the residual integration output that remains after the integration output counted lastly by the counter 78 is supplied to the second ADC 62 disposed at the second stage. However, in the case of a device in which only coarse AD conversion values are used, the configuration may not include the second ADC 62 and only the AD conversion from the first ADC may be used as already described earlier.

Second Embodiment

Given below is the explanation of a photon counting CT device according to a second embodiment. In the photon counting CT device according to the second embodiment, on the side of the first ADC 61, two integrating capacitors are disposed with respect to the integrator 60. At the timing at which the comparator output becomes equal to or greater than the threshold value Vth, an already-discharged integrating capacitor is connected to the integrator 60. With that, the discharging time of the integrating capacitors is no longer required. As compared to the first embodiment, the second embodiment described below differs only in this point. Hence, the following explanation is given only for the differences between the two embodiments, and the common explanation is not repeated. Moreover, in the drawings referred to for explaining the second embodiment, the constituent elements performing the same operations as those in the first embodiment are referred to by the same reference numerals and the detailed explanation thereof is not repeated.

Figure 9:
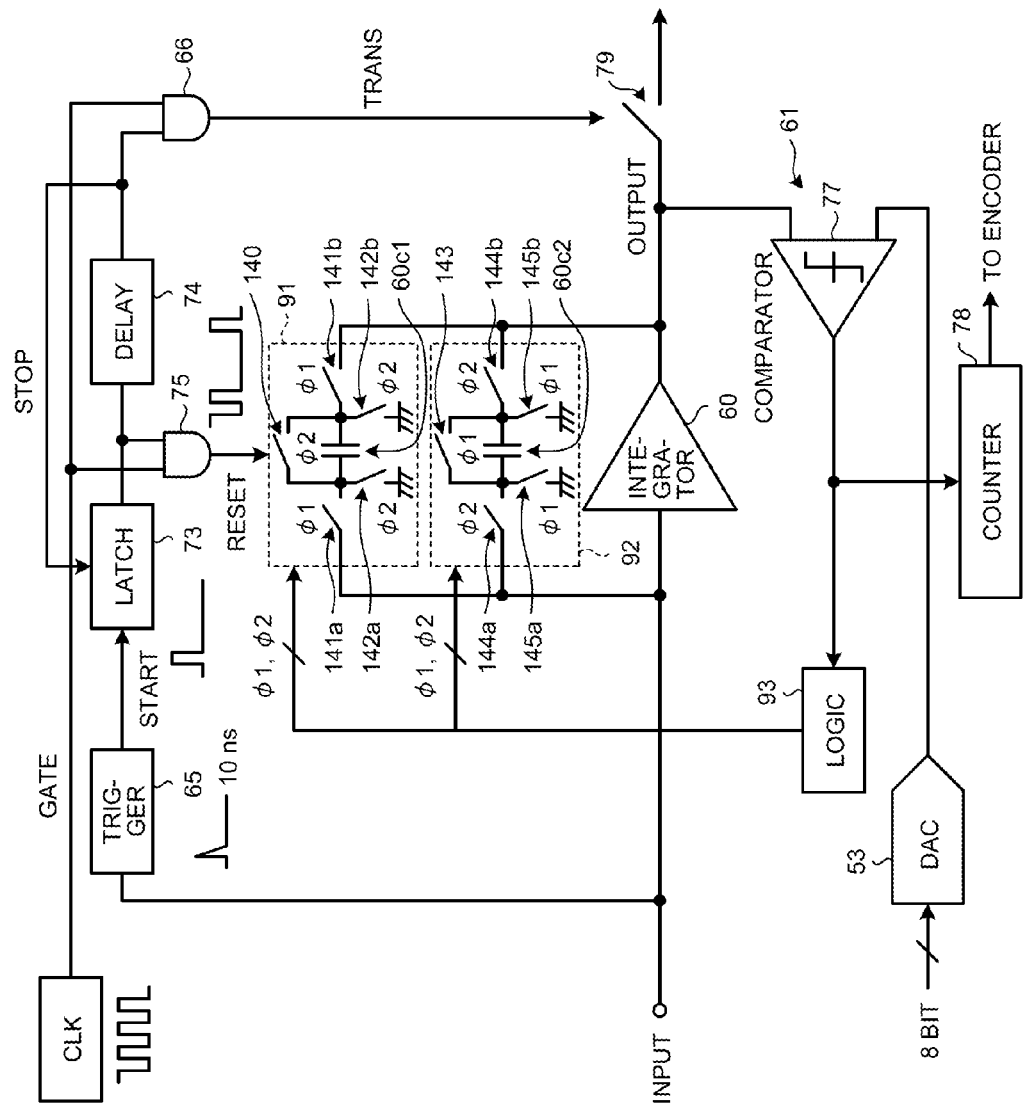
FIG. 9 is a detailed block diagram of the surrounding portion of an integrator and a first ADC of each core in the analog front end of a photon counting CT device according to a second embodiment.

In FIG. 9 is illustrated a detailed block diagram of the surrounding portion of the integrator 60 and the first ADC 61 of each core 51 disposed in the photon counting CT device according to the second embodiment. In the photon counting CT device according to the second embodiment, as illustrated in FIG. 9, to the integrator 60 in each core 51, a first discharging circuit 91 and a second discharging circuit 92 are connected.

The first discharging circuit 91 includes a first integrating capacitor 60$c$1. Moreover, the first discharging circuit 91 includes a discharging switch 140 that, during the period of no integration, periodically discharges the first integration capacitor 60$c$1 using the reset pulse described above. Furthermore, the first discharging circuit 91 includes charging switches 141$a$ and 141$b$ that, during the period of integration, charge the first integration capacitor 60$c$1. Moreover, the first discharging circuit 91 includes discharging switches 142$a$ and 142$b$ that, during the period of integration, discharge the electrical charge stored in the first integrating capacitor 60$c$1.

In an identical manner, the second discharging circuit 92 includes a second integrating capacitor 60$c$2. Moreover, the second discharging circuit 92 includes a discharging switch 143 that, during the period of no integration, periodically discharges the second integration capacitor 60$c$2 using the reset pulse described above. Furthermore, the second discharging circuit 92 includes charging switches 144$a$ and 144$b$ that, during the period of integration, charge the second integration capacitor 60$c$2. Moreover, the second discharging circuit 92 includes discharging switches 145$a$ and 145$b$ that, during the period of integration, discharge the electrical charge stored in the second integrating capacitor 60$c$2.

Besides, in the photon counting CT device according to the second embodiment, the comparison output of the comparator 77 is supplied to a switch control circuit 93. During the period of integration, the switch control circuit 93 performs control to switch among the switches 141$a$, 141$b$, 142$a$, 142$b$, 144$a$, 144$b$, 145$a$, and 145$b$ in such a way that, at the timing at which the comparison output becomes equal to or greater than the threshold value Vth, the already-discharged first integrating capacitor 60c1 or the already-discharged second integrating capacitor 60c2 is connected to the integrator 60.

Figure 10:
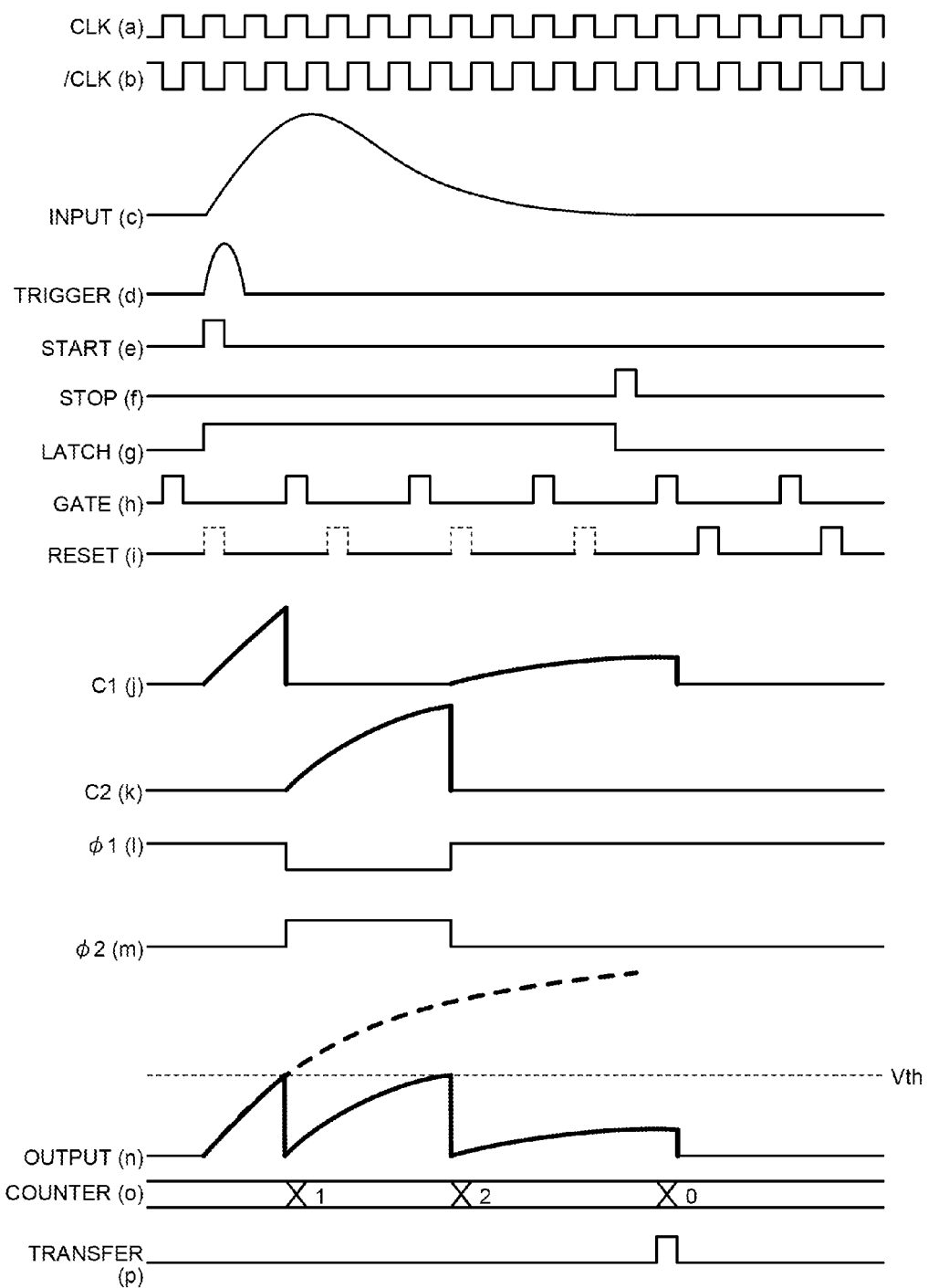
FIG. 10 is a timing chart for explaining the operations of constituent elements surrounding the integrator and the first ADC in each core according to the second embodiment.

FIG. 10 is a timing chart for explaining the operations of these constituent elements. In FIG. 10, the clock referred to by a reference code (a) represents a clock (CLK) supplied from the register 54 to the timing generator 52 illustrated in FIG. 3. Moreover, in FIG. 10, the clock referred to by a reference code (b) represents an inverted clock (/CLK) having the phase thereof inverted by the timing generator 52. Furthermore, in FIG. 10, the signal referred to by a reference code (c) represents the waveform of the electrical charge output from the photomultiplier (SiPM) 59. Moreover, in FIG. 10, the signal referred to by a reference code (d) and the pulse referred to by a reference code (e) represent the start pulse generated in the trigger circuit 65.

Furthermore, in FIG. 10, the pulse referred to by a reference code (g) represents the waveform of a latch output generated by the latch circuit 73 by latching the start pulse for a predetermined period of time. Moreover, in FIG. 10, the pulse referred to by a reference code (f) represents the stop pulse used in stopping the latching operation of the latch circuit 73. Furthermore, in FIG. 10, the pulse referred to by a reference code (h) represents a gate pulse that is used in generating a reset pulse in the first switch control circuit 75. Moreover, in FIG. 10, the pulse referred to by a reference code (i) represents the reset pulse generated in the first switch control circuit 75.

In the photon counting CT device according to the second embodiment, during the period of no integration, the switch control circuit 93 performs control to turn ON the charging switches 141a and 141b, which are used in charging the first integrating capacitor 60c1 of the first discharging circuit 91, and to turn on the discharging switches 145a and 145b, which are used in discharging the second integrating capacitor 60c2 of the second discharging circuit 92, with a first control pulse referred to by a reference code (l) illustrated in FIG. 10. As a result, the first integrating capacitor 60c1 of the first discharging circuit 91 gets charged, while the electrical charge stored in the second integrating capacitor 60c2 of the second discharging circuit 92 gets connected to ground and gets discharged.

Moreover, in the period of no integration, a reset pulse referred to by a reference code (i) illustrated in FIG. 10 is supplied from the first switch control circuit 75 to the discharging switch 140 of the first discharging circuit 91. As a result, during the period of no integration, the electrical charge stored in the first integrating capacitor 60c1 of the first discharging circuit 91 is periodically discharged at the timings of the reset pulse.

On the other hand, during the period of integration in which the latch output, which is referred to by the reference code (g) illustrated in FIG. 10, is at the high level; the supply of the reset pulse, which is referred to by the reference code (i) in FIG. 10, to the discharging switch 140 is stopped. As a result, the periodic discharging of the first integrating capacitor 60c1 is stopped. Hence, as illustrated with reference to a reference code (n) in FIG. 10, the value of the integration output of the integrator 60 gradually increases. The comparator 77 of the first ADC 61 compares the threshold value Vth, which is referred to by the reference code (n) illustrated in FIG. 10, with the value of the integration output. While the value of the integration output is equal to or greater than the threshold value Vth, the comparator 77 supplies a high-level comparison output to the switch control circuit 93.

While the high-level comparison output is being supplied, the switch control circuit 93 sets the first control pulse ($\phi$1), which is referred to by the reference code (l) illustrated in FIG. 10, to the low level. Moreover, while the high-level comparison output is being supplied, the switch control circuit 93 sets a second control pulse ($\phi$2), which is referred to by a reference code (m) illustrated in FIG. 10, to the high level.

As a result, in the first discharging circuit 91, OFF control is performed with respect to the charging switches 141a and 141b due to the first control pulse; ON control is performed with respect to the discharging switches 142a and 142b due to the second control pulse; and the electrical charge stored in the first integrating capacitor 60c1 is discharged. Consequently, as illustrated with reference to the reference code (j) in FIG. 10, the waveform representing the quantity of electrical charge stored in the first integrating capacitor 60c1 steeply falls down (i.e., the quantity of electrical charge decreases due to discharging) at the timing at which the first control pulse is set to the low level and the second control pulse is set to the high level.

In contrast, in the second discharging circuit 92, ON control is performed with respect to the charging switches 144a and 144b due to the second control pulse ($\phi$2); OFF control with respect to the discharging switches 145a and 145b due to the first control pulse; and storing of the electrical charge in the second integrating capacitor 60c2 is started. Consequently, as illustrated with reference to a reference code (k) in FIG. 10, the waveform representing the quantity of electrical charge stored in the second integrating capacitor 60c2 gradually rises (i.e., the electrical charge gradually increases) at the timing at which the first control pulse is set to the low level and the second control pulse is set to the high level.

Thus, in the photon counting CT device according to the second embodiment, when the period of integration starts and the value of the integration output becomes equal to or greater than the threshold value Vth for the first time, the integrating capacitor connected to the integrator 60 is switched from the first integrating capacitor 60c1 to the already-discharged second integrating capacitor 60c2.

When the quantity of electrical charge gradually increases as a result of the start of storing the electrical charge in the second integrating capacitor 60c2 of the second discharging circuit 92, the value of the integration output again becomes equal to or greater than the threshold value Vth as illustrated with reference to the reference code (n) in FIG. 10. Hence, the comparator 77 again supplies a high-level comparison output to the switch control circuit 93.

When the high-level comparison output is again supplied thereto, the switch control circuit 93 sets the first control pulse ($\phi$1), which is referred to by the reference code (l) illustrated in FIG. 10, to the high level. Moreover, the switch control circuit 93 sets the second control pulse ($\phi$2), which is referred to by the reference code (m) illustrated in FIG. 10, to the low level.

As a result, in the first discharging circuit 91, ON control is performed with respect to the charging switches 141a and 141b due to the first control pulse; OFF control is performed with respect to the discharging switches 142a and 142b due to the second control pulse; and storing of the electrical charge in the first integrating capacitor 60c1 is started. Consequently, as illustrated with reference to the reference code (j) in FIG. 10, the waveform representing the quantity of electrical charge stored in the second integrating capacitor 60c2 gradually rises (i.e., the electrical charge gradually increases) at the timing at which the first control pulse is set to the high level and the second control pulse is set to the low level.

In contrast, in the second discharging circuit 92, the charging switches 144a and 144b are subjected to OFF control due to the second control pulse ($\phi$2); the discharging switches 145a and 145b are subjected to ON control due to the first control pulse; and the electrical charge stored in the second integrating capacitor 60c2 is discharged. Consequently, as illustrated with reference to the reference code (k) in FIG. 10, the waveform representing the quantity of electrical charge stored in the second integrating capacitor 60c2 steeply falls down (i.e., the quantity of electrical charge decreases due to discharging) at the timing at which the first control pulse is set to the high level and the second control pulse is set to the low level.

Thus, in the photon counting CT device according to the second embodiment, when the value of the integration output once again becomes equal to or greater than the threshold value Vth, the integrating capacitor connected to the integrator 60 is switched from the second integrating capacitor 60c2 to the already-discharged first integrating capacitor 60c1. In the photon counting CT device according to the second embodiment, during the period of integration, every time the integration output becomes equal to or greater than the threshold value Vth, the integrating capacitor connected to the integrator 60 is switched between the first integrating capacitor 60c1 and the second integrating capacitor 60c2.

As a result, during the period of integration, every time the integration output becomes equal to or greater than the threshold value Vth, an already-discharged capacitor can be connected to the integrator 60. Hence, not only the discharging time of an integrating capacitor is no longer required but it also becomes possible to achieve the same effect as the effect achieved in the first embodiment.

As illustrated with reference to a reference code (o) in FIG. 10, the counter 78 counts the number of times for which the integration output becomes equal to or greater than the threshold value Vth; and supplies the count value as the AD conversion output of the first ADC 61 to the encoder 63. That is same as the explanation given in the first embodiment. Moreover, the residual integration output that remains after the integration output counted lastly by the counter 78 is either supplied to the second ADC 62, which is disposed at the second stage, at the timing of the output control pulse referred to by a reference code (p) illustrated in FIG. 10 or destroyed. That is also same as the explanation given in the first embodiment.

Third Embodiment

Given below is the explanation of a photon counting CT device according to a third embodiment. The following explanation of the third embodiment is given only for the differences with the embodiments described above, and the common explanation is not repeated. Moreover, in the drawings referred to for explaining the third embodiment, the constituent elements performing the same operations as those in the embodiments described above are referred to by the same reference numerals and the detailed explanation thereof is not repeated.

Figure 11:
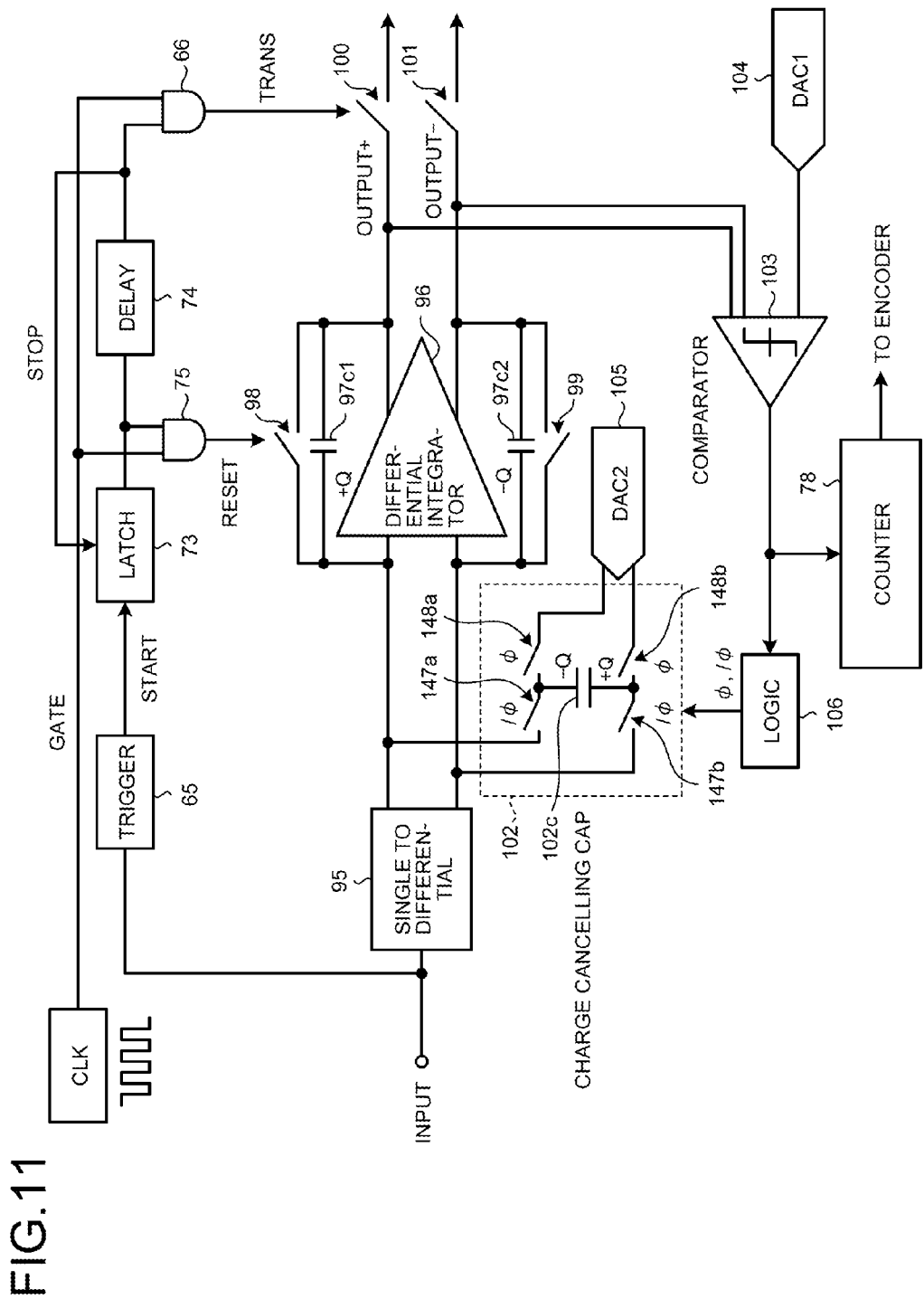
FIG. 11 is a detailed block diagram of the surrounding portion of an integrator and a first ADC of each core in the analog front end of a photon counting CT device according to a third embodiment.

In FIG. 11 is illustrated a detailed block diagram of the surrounding portion of the integrator and the first ADC of each core 51 disposed in the photon counting CT device according to the third embodiment. As illustrated in FIG. 11, in the photon counting CT device according to the third embodiment, each core 51 includes a differential converter unit 95 that generates two signals having mutually reverse phases (i.e., generates a differential output) from the input of a single phase as the electrical charge output from the SiPM 59. Moreover, each core 51 includes an integrator having a differential amplifier 96, a first integrating capacitor 97c1, and a second integrating capacitor 97c2. In the first integrating capacitor 97c1 is stored a positive electrical charge (+Q), while in the second integrating capacitor 97c2 is stored a negative electrical charge (−Q).

Furthermore, each core includes a first discharging switch 98 that is used in periodically discharging the positive electrical charge stored in the first integrating capacitor 97c1; and includes a second discharging switch 99 that is used in periodically discharging the electrical charge stored in the second integrating capacitor 97c2. Moreover, each core 51 includes a first output control switch 100 that is used in outputting a positive integration output from the differential amplifier 96; and includes a second output control switch 101 that is used in outputting a negative integration output from the differential amplifier 96.

Furthermore, each core 51 includes a DA converter 104 that sets a positive threshold value +Vth and a negative threshold value −Vth; and includes a comparator 103 that compares the positive and negative integration outputs from the differential amplifier 96 with the positive threshold value +Vth and the negative threshold value −Vth, respectively, that are set by the DA converter 104. Moreover, each core 51 includes a DA converter 105 that is used in setting, during discharging, the electrical charge stored in the first integrating capacitor 97c1 and the second integrating capacitor 97c2 to an arbitrary electrical potential. Furthermore, each core 51 includes an electrical charge cancellation circuit 102 that, depending on the comparison output from the comparator 103, adds a negative electrical charge to the positive differential output from the differential converter unit 95 and adds a positive electrical charge to the negative differential output from the differential converter unit 95.

The electrical charge cancellation circuit 102 includes a capacitor 102c that charges the positive electrical charge (+Q) and the negative electrical charge (−Q); and includes switches 147a (/ϕ), 147b (/ϕ), 148 (ϕ), and 148b (ϕ) that set the differential outputs from the differential converter unit 95 to the electrical potentials set in the DA converter 105. Each core 51 further includes a switch control circuit 106 that controls the switching among the switches 147a, 147b, 148a, and 148b of the electrical charge cancellation circuit 102 according to the comparison output from the comparator 103.

Figure 12:
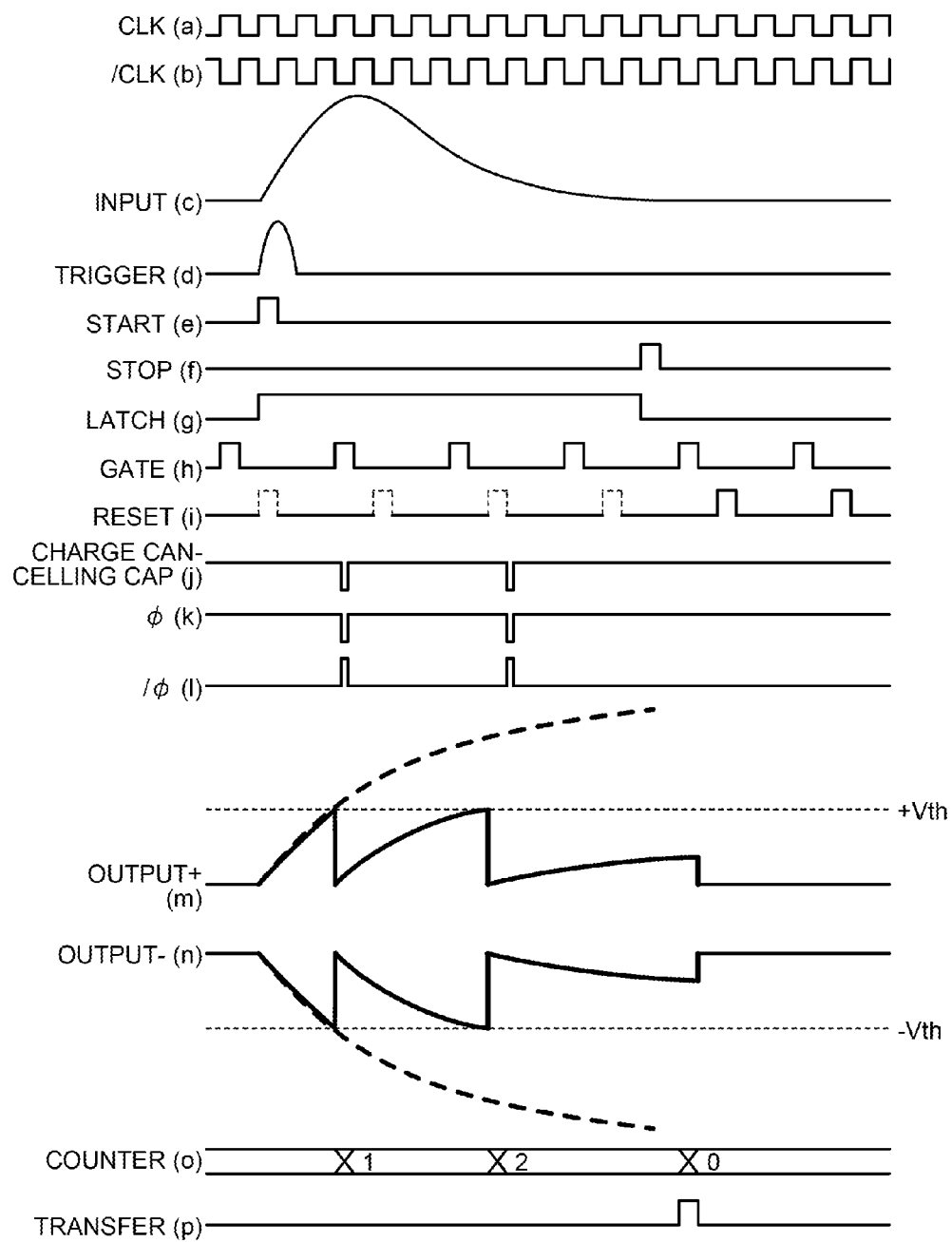
FIG. 12 is a timing chart for explaining the operations of constituent elements surrounding the integrator and the first ADC in each core according to the third embodiment.

FIG. 12 is a timing chart for explaining the operations of these constituent elements. In FIG. 12, the clock referred to by a reference code (a) represents a clock (CLK) supplied from the register 54 to the timing generator 52 illustrated in FIG. 3. Moreover, in FIG. 12, the clock referred to by a reference code (b) represents an inverted clock (/CLK) having the phase thereof inverted by the timing generator 52. Furthermore, in FIG. 12, the signal referred to by a reference code (c) represents the waveform of the electrical charge output from the photomultiplier (SiPM) 59. Moreover, in FIG. 12, the signal referred to by a reference code (d) and the pulse referred to by a reference code (e) represent the start pulse generated in the trigger circuit 65.

Furthermore, in FIG. 12, the pulse referred to by a reference code (g) represents the waveform of a latch output generated by the latch circuit 73 by latching the start pulse for a predetermined period of time. Moreover, in FIG. 12, the pulse referred to by a reference code (f) represents the stop pulse used in stopping the latching operation of the latch circuit 73. Furthermore, in FIG. 12, the pulse referred to by a reference code (h) represents a gate pulse that is used in generating a reset pulse in the first switch control circuit 75. Moreover, in FIG. 12, the pulse referred to by a reference code (i) represents the reset pulse generated in the first switch control circuit 75.

In the photon counting CT device according to the third embodiment, the differential converter unit 95 generates two signals having mutually reverse phases (i.e., generates a differential output) from the input of a single phase as the electrical charge output from the SiPM 59; and supplies the two signals to the differential amplifier 96. As a result, in the first integrating capacitor 97$c$1, a positive electrical charge (+Q) gets stored. Moreover, in the second integrating capacitor 97$c$2, a negative electrical charge (−Q) gets stored. During the period of no integration, the reset pulse referred to by the reference code (i) illustrated in FIG. 12 is supplied from the first switch control circuit 75 to the first discharging switch 98 and the second discharging switch 99. Therefore, during the period of no integration, the electrical charge stored in the first integrating capacitor 97$c$1 and the second integrating capacitor 97$c$2 is periodically discharged at the timings of the reset pulse.

Moreover, during the period of no integration, the switch control circuit 106 is supplied with the low-level comparison output from the comparator 103. When the low-level comparison output is supplied thereto, the switch control circuit 106 performs control to turn ON the switches 148$a$ and 148$b$. As a result, during the period of no integration, the electrical charge set by the DA converter 105 gets stored in the capacitor 102$c$. Herein, the capacitor 102$c$ has the substantially same electrical storage capacity as the electrical storage capacity of the first integrating capacitor 97$c$1 and the second integrating capacitor 97$c$2. Thus, the capacitor 102$c$ stores therein the substantially same quantity of the positive electrical charge (+Q) as the quantity of the positive electrical charge (+Q) stored in the first integrating capacitor 97$c$1. Similarly, the capacitor 102$c$ stores therein the substantially same quantity of the negative electrical charge (−Q) as the quantity of the negative electrical charge (−Q) stored in the second integrating capacitor 97$c$2.

Meanwhile, during the period of integration in which the latch output, which is referred to by the reference code (g) illustrated in FIG. 12, is set to the high level; the supply of the reset pulse, which is referred to by the reference code (i) illustrated in FIG. 12, to the discharging switches 98 and 99 is stopped. As a result, the periodic discharging of the first integrating capacitor 97$c$1 and the second integrating capacitor 97$c$2 is stopped. Hence, as illustrated with reference to a reference code (m) in FIG. 12, the value of the positive integration output from the differential amplifier 96 gradually increases. On the other hand, as illustrated with reference to a reference code (n) in FIG. 12, the value of the negative integration output from the differential amplifier 96 gradually decreases.

The comparator 103 compares the positive integration output with the positive threshold value +Vth, which is set by the DA converter 104 and which is referred to by the reference code (m) illustrated in FIG. 12; and supplies a positive comparison output to the switch control circuit 106. Moreover, the comparator 103 compares the negative integration output with the negative threshold value −Vth, which is set by the DA converter 104 and which is referred to by the reference code (n) illustrated in FIG. 12; and supplies a negative comparison output to the switch control circuit 106.

Until the value of the positive integration output exceeds the positive threshold value +Vth or until the value of the negative integration output exceeds the negative threshold value −Vth; the switch control circuit 106 performs control to turn OFF the switches 147$a$ and 147$b$ of the electrical charge cancellation circuit 102 using a high-level first switching signal (4) referred to by a reference code (k) illustrated in FIG. 12. Alternatively, the switch control circuit 106 performs control to turn OFF the switches 147$a$ and 147$b$ of the electrical charge cancellation circuit 102 using a low-level second switching signal (/φ) referred to by a reference code (l) illustrated in FIG. 12. As a result, as illustrated with reference to the reference code (j) in FIG. 12, until the value of the positive comparison output exceeds the positive threshold value +Vth or until the value of the negative comparison output exceeds the negative threshold value −Vth; the capacitor 102$c$ gets charged. Moreover, the negative electrical charge (−Q) and the positive electrical charge (+Q) get stored in the capacitor 102$c$.

Then, as illustrated with reference to the reference code (m) in FIG. 12, the value of the positive integration output becomes equal to or greater than the positive threshold value +Vth. Alternatively, as illustrated with reference to the reference code (n) in FIG. 12, the value of the negative integration output becomes equal to or smaller than the negative threshold value −Vth. When the comparison output indicating the abovementioned fact is supplied to the switch control circuit 106 from the comparator 103, the switch control circuit 106 performs control to turn OFF the switches 148$a$ and 148$b$ of the electrical charge cancellation circuit 102 using a low-level first switching signal (φ) referred to by the reference code (k) illustrated in FIG. 12. As a result, the charging of the capacitor 102$c$ is stopped.

Meanwhile, while the value of the positive comparison output is exceeding the positive threshold value +Vth or while the value of the negative comparison output is exceeding the negative threshold value −Vth; the switch control circuit 106 performs control to turn ON the switches 147$a$ and 147$b$ of the electrical charge cancellation circuit 102 using a high-level second switching signal (/φ) referred to by the reference code (l) illustrated in FIG. 12. As a result, while the value of the positive comparison output is exceeding the positive threshold value +Vth or while the value of the negative comparison output is exceeding the negative threshold value −Vth; the negative electrical charge (−Q) stored in the capacitor 102$c$ is added to the positive differential output, or the positive electrical charge (+Q) stored in the capacitor 102$c$ is added to the negative differential output.

The capacitor 102$c$ has the substantially same electrical storage capacity as the electrical storage capacity of the first integrating capacitor 97$c$1 and the second integrating capacitor 97$c$2. Moreover, the quantity of the positive electrical charge of the capacitor 102$c$ is equal to the quantity of the positive electrical charge of the first integrating capacitor 97$c$1; and the quantity of the negative electrical charge of the capacitor 102$c$ is equal to the quantity of the negative electrical charge of the second integrating capacitor 97$c$2. For that reason, the positive differential output supplied from the differential converter unit 95 can be cancelled out by the negative electrical charge (−Q), while the negative differential output can be cancelled out by the positive electrical charge (+Q). Then, as illustrated with reference to the reference codes (m) and (n) in FIG. 12, the electrical potential of the positive integration output and the electrical potential of the negative integration output from the differential amplifier 96 can be respectively set to be same as the electrical potential of the first integrating capacitor 97$c$1 during discharging and the electrical potential of the second integrating capacitor 97$c$2 during discharging.

During the period of integration, every time the comparator 103 supplies a comparison output indicating that the value of the positive integration output has become equal to or greater than the positive threshold value +Vth or that the value of the negative integration output has become equal to or smaller than the negative threshold value −Vth; the switch control circuit 106 performs control to switch among the switches 147a, 147b, 148a, and 148b of the electrical charge cancellation circuit 102 in such a way that an electrical charge of reverse polarity is added to each differential output. As a result, every time a positive integration output exceeds the positive threshold value +Vth or a negative integration output exceeds the negative threshold value −Vth, it becomes possible to reset the electrical potential of the integration output to the electrical potential during discharging. Hence, it becomes possible to achieve the same effect as the effect achieved in the first embodiment.

As illustrated with reference to a reference code (o) in FIG. 12, the counter 78 counts the number of times for which the value of the positive integration output becomes equal to or greater than the positive threshold value +Vth and counts the number of times for which the value of the negative integration output becomes equal to or smaller than the negative threshold value −Vth. Then, in an identical manner to the first embodiment, the counter 78 supplies the count value as the AD conversion output of the first ADC 61 to the encoder 63. Moreover, the residual positive integration output and the residual negative integration output, which remains after the integration output counted lastly by the counter 78, is either supplied to the second ADC 62, which is disposed at the second stage, at the timing of the output control pulse referred to by a reference code (p) illustrated in FIG. 12 via the first output control switch 100 or the second output control switch 101, or destroyed. That is also same as the explanation given in the first embodiment.

Fourth Embodiment

Given below is the explanation of a photon counting CT device according to a fourth embodiment. In the embodiments described above, a single threshold value Vth is set with respect to the comparator 77. Moreover, in the third embodiment, a single positive threshold value +Vth is set with respect to the positive integration output, and a single negative threshold value −Vth is set with respect to the negative integration output. In contrast, in the fourth embodiment described below, a plurality of threshold values of mutually different levels is set with respect to the integration output. Meanwhile, as compared to the embodiments described above, the fourth embodiment described below differs only in this point. Hence, the following explanation is given only for the differences with the embodiments described above, and the common explanation is not repeated. Moreover, in the drawings referred to for explaining the fourth embodiment, the constituent elements performing the same operations as those in the embodiments described above are referred to by the same reference numerals and the detailed explanation thereof is not repeated.

Figure 13:
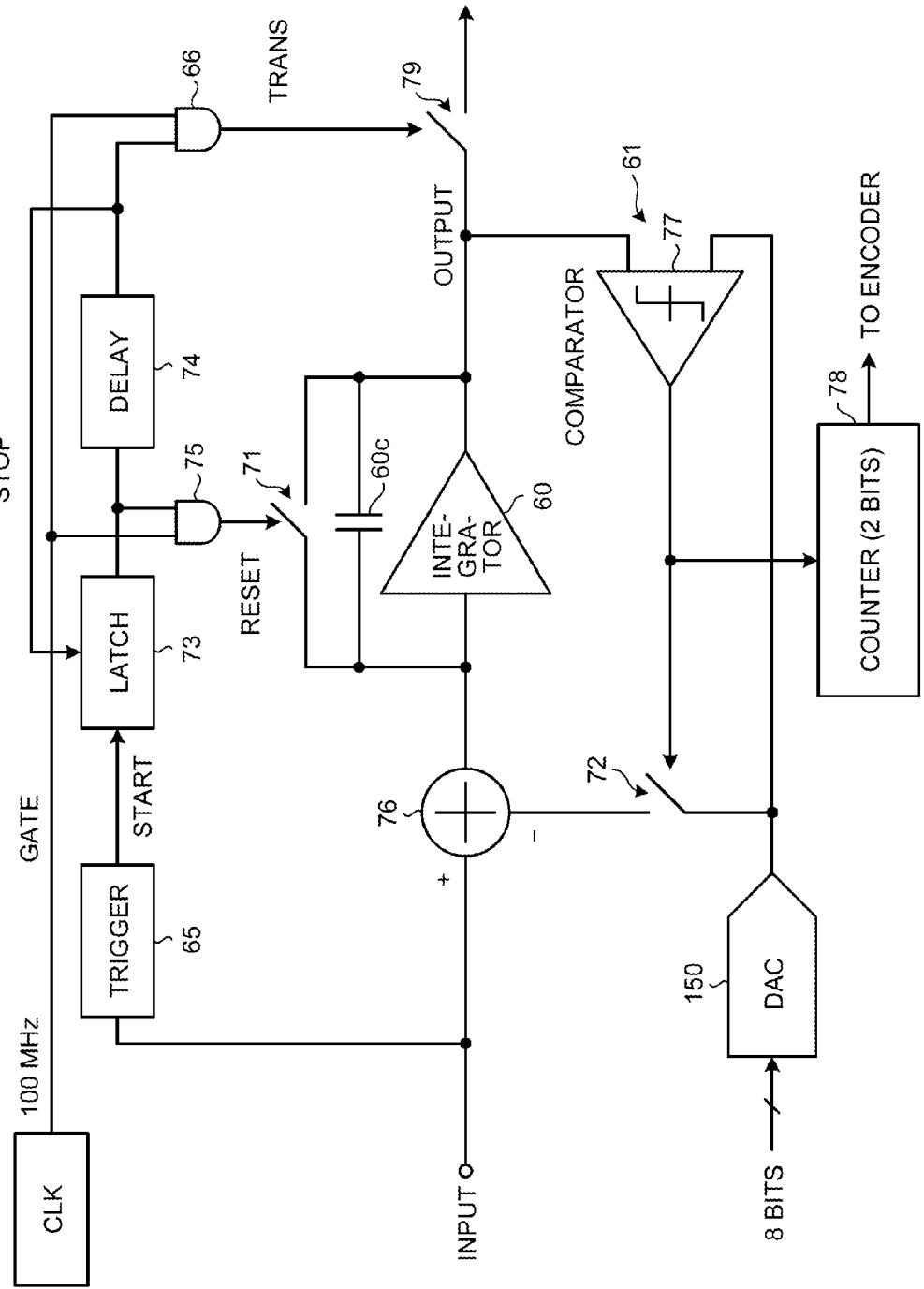
FIG. 13 is a detailed block diagram of the surrounding portion of an integrator and a first ADC of each core in the analog front end of a photon counting CT device according to a fourth embodiment.

In FIG. 13 is illustrated a detailed block diagram of the surrounding portion of the integrator 60 and the first ADC 61 of each core 51 in the photon counting CT device according to the fourth embodiment. As illustrated in FIG. 13, in the photon counting CT device according to the fourth embodiment, a DA converter 150 sets a first threshold value Vth1 and a second threshold value Vth2, which is a higher value than the first threshold value Vth1, with respect to the comparator 77 to which the integration output is supplied.

Figure 14:
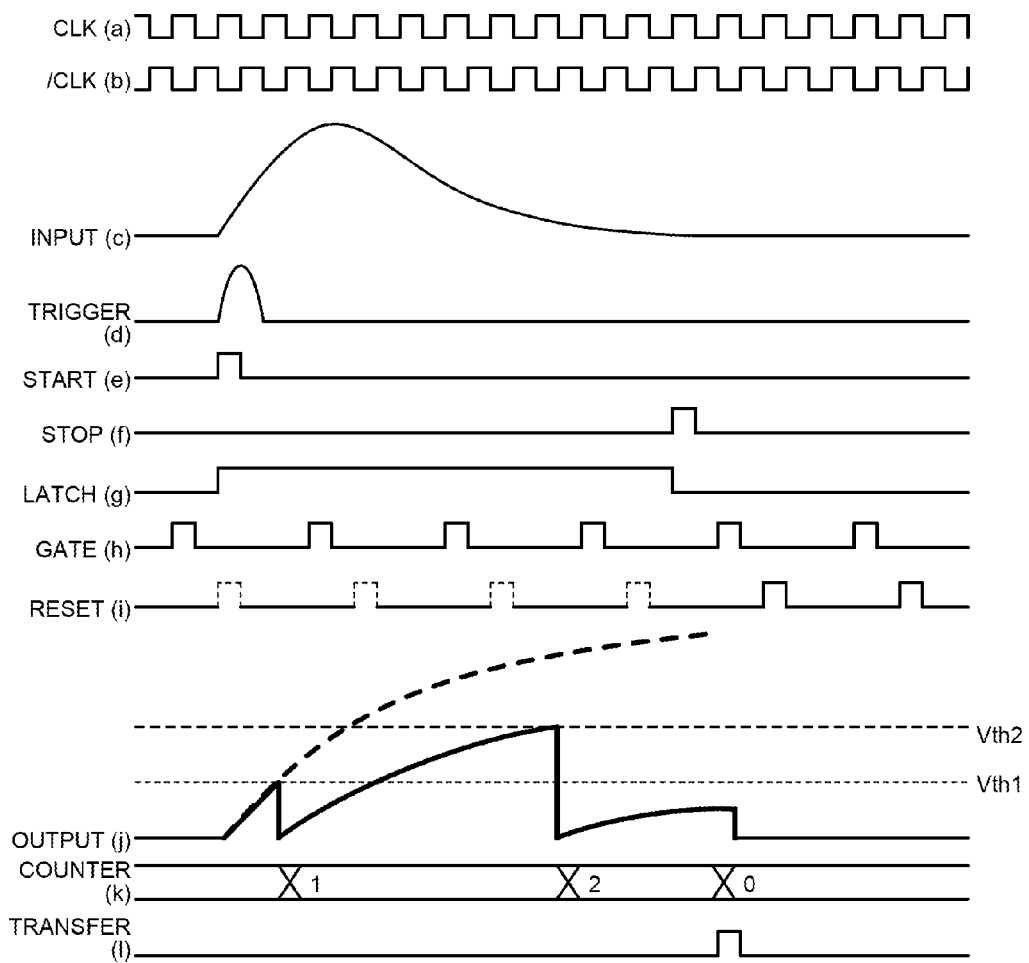
FIG. 14 is a timing chart for explaining the operations of constituent elements surrounding the integrator and the first ADC in each core according to the fourth embodiment.

FIG. 14 is a timing chart for explaining the operations of the constituent elements. In FIG. 14, the clock referred to by a reference code (a) represents a clock (CLK) supplied from the register 54 to the timing generator 52 illustrated in FIG. 3. Moreover, in FIG. 14, the clock referred to by a reference code (b) represents an inverted clock (/CLK) having the phase thereof inverted by the timing generator 52. Furthermore, in FIG. 14, the signal referred to by a reference code (c) represents the waveform of the electrical charge output from the photomultiplier (SiPM) 59. Moreover, in FIG. 14, the signal referred to by a reference code (d) and the pulse referred to by a reference code (e) represent the start pulse generated in the trigger circuit 65.

Furthermore, in FIG. 14, the pulse referred to by a reference code (g) represents the waveform of a latch output generated by the latch circuit 73 by latching the start pulse for a predetermined period of time. Moreover, in FIG. 14, the pulse referred to by a reference code (f) represents the stop pulse used in stopping the latching operation of the latch circuit 73. Furthermore, in FIG. 14, the pulse referred to by a reference code (h) represents a gate pulse that is used in generating a reset pulse in the first switch control circuit 75. Moreover, in FIG. 14, the pulse referred to by a reference code (i) represents the reset pulse generated in the first switch control circuit 75.

Figure 15:
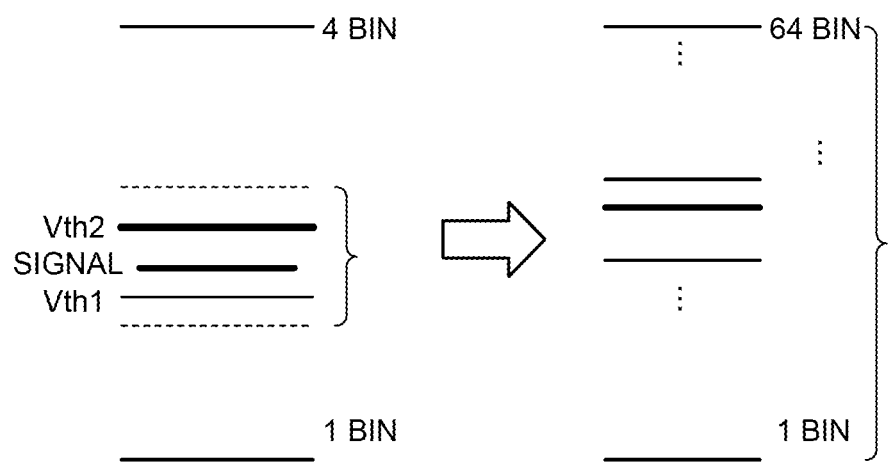
FIG. 15 is a diagram for giving explanation about the resolution that is enhanced as a result of having AD converters in two stages.

In the photon counting CT device according to the fourth embodiment, as illustrated with reference to a reference code (j) in FIG. 14, the DA converter 150 firstly sets the first threshold value Vth1 in the comparator 77. Then, during the period of integration, at the timing at which a comparison output is supplied as an indication of the fact that the integration output has become equal to or greater than the first threshold value Vth1, the second threshold value Vth2 having a higher value than the first threshold value Vth1 is set in the comparator 77 by the DA converter 150. Thereafter, during the period of integration, the comparator 77 compares the integration output with the second threshold value Vth2. As a result of performing the comparison in such a stepwise manner, as illustrated in FIG. 15, it becomes possible to enhance the apparent resolution with respect to the specified AD conversion area. Besides, it is also possible to achieve the same effects as the effects achieved in the embodiments described above.

As illustrated with reference to a reference code (k) in FIG. 14, the counter 78 counts the total of the number of times for which the value of the integration output becomes equal to or greater than the first threshold value Vth1 and the number of times for which the value of the integration output becomes equal to or greater than the second threshold value Vth2. Then, in an identical manner to the first embodiment, the counter 78 supplies the total count value as the AD conversion output of the first ADC 61 to the encoder 63. Moreover, the residual integration output, which remains after the integration output counted lastly by the counter 78, is either supplied to the second ADC 62, which is disposed at the second stage, at the timing of the output control pulse referred to by a reference code (l) illustrated in FIG. 14 via the output control switch, or destroyed. That is also same as the explanation given in the first embodiment.

In this example, two threshold values, namely, Vth1 and Vth2 are set. However, alternatively, it is also possible to set three or more different threshold values. Moreover, in the example illustrated in FIG. 13, the fourth embodiment is implemented in the circuit configuration according to the first embodiment. Alternatively, the fourth embodiment can also be implemented in the second embodiment and the third embodiment. In the case of implementing the fourth embodiment in the third embodiment, a plurality of different positive threshold values +Vth is set and a plurality of different negative threshold values −Vth is set. In each case, it is possible to achieve the same effects as the effects described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal processing device comprising:
an integrator configured to integrate an electrical charge corresponding to electromagnetic waves, the integrator including an integrating capacitor configured to store the electrical charge corresponding to the electromagnetic waves and a discharging circuit configured to discharge the integrating capacitor;
an integration period setting unit configured to set a period of integration of the electrical charge with respect to the integrator; and
an analog-to-digital converter including a comparator configured to compare an integration output and a predetermined threshold value and a counter configured to output, as digital data of the electrical charge, the number of times for which a value of the integration output becomes equal to or greater than the predetermined threshold value, the analog-to-digital converter being configured to discharge the integrating capacitor during the period of integration by supplying a comparison output of the comparator to the discharging circuit while a value of the integration value is equal to or greater than the predetermined threshold value.

2. The device according to claim 1, wherein the analog-to-digital converter is configured to perform an analog-to-digital conversion operation in which digital data of the electrical charge is generated, on a parallel with an integration operation performed by the integrator.

3. The device according to claim 1, wherein
the integrator includes at least two integrating capacitors configured to store the electrical charge, and at least two discharging circuits configured to store electrical charge in the integrating capacitors and discharge the integrating capacitors, and
the device further comprises a discharge controller configured to connect an integrating capacitor in the discharged state to the integrator during the period of integration in a way that the discharging circuits are controlled so as to switch an integrating capacitor in an electrical charge storing state to a discharged state and to switch an integrating capacitor in the discharged state to the electrical charge storing state every time the comparison output of the comparator becomes equal to or greater than the predetermined threshold value.

4. The device according to claim 1, wherein
the integrator includes an integrating capacitor configured to store a positive electrical charge and an integrating capacitor configured to store a negative electrical charge,
the device further comprises
a differential converter unit configured to generate, from the electrical charge corresponding to electromagnetic waves, a positive electrical charge and a negative electrical charge having mutually different polarities, and supply the positive electrical charge and the negative electrical charge to the integrator;
a capacitor having a substantially same capacity as the integrating capacitors and configured to store a positive electrical charge and a negative electrical charge; and
an electrical charge cancellation circuit configured to cancel out the electrical charge supplied to the integrator during the period of integration in a way that the negative electrical charge stored in the capacitor is supplied to a line for supplying a positive electrical charge from the differential converter unit to the integrator and the positive electrical charge stored in the capacitor is supplied to a line for supplying a negative electrical charge from the differential converter unit to the integrator every time the comparison output of the comparator becomes equal to or greater than the predetermined threshold value.

5. The device according to claim 1, wherein
the comparator is set with at least a first threshold value and a second threshold value that are different from each other, and
the comparator is configured to perform a comparison operation in which the first threshold value is compared with the integration output and, after a value of the integration output becomes equal to or greater than the first threshold value, the second threshold value is compared with the integration output.

6. A signal processing method comprising:
setting a period of integration of an electrical charge with respect to an integrator that includes an integrating capacitor configured to store therein the electrical charge corresponding to electromagnetic waves and a discharging circuit configured to discharge the integrating capacitor, the integrator being configured to integrate the electrical charge corresponding to the electromagnetic waves; and
discharging, by an analog-to-digital converter, the integrating capacitor during the period of integration by supplying a comparison output of a comparator to the discharging circuit while a value of an integration value is equal to or greater than a predetermined threshold value, the analog-to-digital converter including the comparator configured to compare the integration output and a predetermined threshold value and a counter configured to output, as digital data of the electrical charge, the number of times for which a value of the integration output becomes equal to or greater than the predetermined threshold value.

* * * * *